(12) United States Patent
Hsieh

(10) Patent No.: US 8,760,230 B2
(45) Date of Patent: Jun. 24, 2014

(54) SWITCHING AMPLIFIER WITH PULSED CURRENT SOURCE AND SINK

(76) Inventor: Wen-Hsiung Hsieh, Keelung (TW)

( * ) Notice: Subject to any disclaimer, the term of this patent is extended or adjusted under 35 U.S.C. 154(b) by 42 days.

(21) Appl. No.: 13/536,800

(22) Filed: Jun. 28, 2012

(65) Prior Publication Data

US 2014/0002189 A1  Jan. 2, 2014

(51) Int. Cl.
*H03F 3/217* (2006.01)

(52) U.S. Cl.
USPC .............................. 330/251; 330/10

(58) Field of Classification Search
USPC ........................ 330/10, 207 A, 251
See application file for complete search history.

(56) References Cited

U.S. PATENT DOCUMENTS

| | | | |
|---|---|---|---|
| 3,629,616 A | 12/1971 | Walker | |
| 4,531,096 A | 7/1985 | Yokoyama | |
| 5,014,016 A | 5/1991 | Anderson | |
| 5,115,205 A | 5/1992 | Holmes, Jr. | |
| 5,160,896 A | 11/1992 | Mccorkle | |
| 5,781,067 A | 7/1998 | Tota | |
| 5,805,020 A | 9/1998 | Danz | |
| 5,949,282 A | 9/1999 | Nguyen | |
| 5,986,498 A | 11/1999 | Rodriguez | |
| 6,356,151 B1 | 3/2002 | Nalbant | |
| 6,392,476 B1 | 5/2002 | Rodriguez | |
| 6,489,839 B2 | 12/2002 | Maaskant | |
| 6,563,377 B2 | 5/2003 | Butler | |
| 6,794,932 B1 | 9/2004 | Butler | |
| 6,844,777 B2 | 1/2005 | Kitamura | |
| 6,922,101 B2 | 7/2005 | Bayko | |
| 7,030,694 B2 | 4/2006 | Jonkman | |
| 7,286,008 B2 | 10/2007 | Watts | |
| 7,307,474 B2 | 12/2007 | Nguyen | |
| 7,323,919 B2 * | 1/2008 | Yang et al. | 327/172 |
| 7,400,191 B2 | 7/2008 | Rodriguez | |
| 7,633,336 B2 | 12/2009 | Bean | |
| 7,705,672 B1 | 4/2010 | Rodriguez | |
| 7,816,985 B2 | 10/2010 | Attwood | |
| 7,948,313 B2 * | 5/2011 | Tsuji et al. | 330/251 |
| 7,952,426 B2 | 5/2011 | Mun | |
| 7,961,047 B2 | 6/2011 | Pillonnet | |
| 7,969,126 B2 | 6/2011 | Stanley | |
| 8,144,880 B2 * | 3/2012 | Chen et al. | 381/28 |
| 2004/0125968 A1 * | 7/2004 | Pearce et al. | 381/120 |
| 2011/0063027 A1 * | 3/2011 | Kishii et al. | 330/251 |
| 2011/0235831 A1 * | 9/2011 | Kaiho et al. | 381/190 |

* cited by examiner

*Primary Examiner* — Henry Choe

(57) ABSTRACT

A switching amplifying method or a switching amplifier for obtaining one or more than one linearly amplified replicas of an input signal, is highly efficient, and does not have the disadvantage of "dead time" problem related to the class D amplifiers. Said switching amplifying method comprises the steps of: receiving the input signal; pulse modulating the input signal for generating a pulse modulated signal; switching at least one pulsed current flowing to a first input terminal of a filter according to the pulse modulated signal when the polarity of the input signal is positive; switching at least one pulsed current flowing from the first input terminal of the filter according to the pulse modulated signal when the polarity of the input signal is negative; filtering all said pulsed currents flowing through the first input terminal for getting an output signal.

20 Claims, 12 Drawing Sheets

SWITCHING AMPLIFIER WITH PULSED CURRENT SOURCE AND SINK

BACKGROUND OF THE INVENTION (1) Field of the Invention

This invention is related in general to a power amplifier, and more particularly, to a switching amplifier that can efficiently and linearly amplify an input signal having first and second polarities for obtaining a low-distortion output signal.

(2) Description of the Related Art

Amplifiers are electronic devices which are used for increasing the power of a signal, and are generally categorized into various classes. The popular amplifiers include class A, class B and class D amplifiers. Reference is made to the exemplary U.S. patents that disclose various types of amplifiers: U.S. Pat. Nos. 7,952,426; 7,816,985; 7,400,191; 7,286,008; 6,922,101; 6,794,932; 6,563,377; 6,356,151; 6,282,747; 5,949,282; 5,805,020; 5,767,740; 5,160,896; 5,115,205; 5,014,016; 4,531,096 and 3,629,616.

In general, class A amplifiers produce a linearly amplified replica of an input signal, but are inefficient in terms of power usage because the amplifying elements are always biased and conducting, even if there is no input.

Class B amplifiers only amplify half of the input wave cycle, thus creating a large amount of distortion, but their efficiency is greatly improved and is much better than class A. A practical circuit using class B elements is the push-pull stage, such as the very simplified complementary pair arrangement. Complementary or quasi-complementary devices are each used for amplifying the opposite halves of the input signal, which is then recombined at the output. This arrangement gives excellent efficiency, but can suffer from the drawback that there is a small mismatch in the cross-over region—at the "joins" between the two halves of the signal, as one output device has to take over supplying power exactly as the other finishes. This is called crossover distortion.

In a class D amplifier an input signal is converted to a sequence of higher voltage output pulses. The averaged-over-time power values of these pulses are directly proportional to the instantaneous amplitude of the input signal. The frequency of the output pulses is typically ten or more times the highest frequency in the input signal to be amplified. The output pulses contain inaccurate spectral components (that is, the pulse frequency and its harmonics) which must be removed by a low-pass passive filter. The resulting filtered signal is then a linearly amplified replica of the input.

The main advantage of a class D amplifier is power efficiency. Because the output pulses have fixed amplitude, the switching elements are switched either completely on or completely off, rather than operated in linear mode.

However, one significant challenge for a driver circuit in class D amplifiers is keeping dead times as short as possible. "Dead time" is the period during a switching transition when both output MOSFETs are driven into Cut-Off Mode and both are "off". Dead times need to be as short as possible to maintain an accurate low-distortion output signal, but dead times that are too short cause the MOSFET that is switching on to start conducting before the MOSFET that is switching off has stopped conducting. The MOSFETs effectively short the output power supply through themselves, a condition known as "shoot-through". Driver failures that allow shoot-through result in excessive losses and sometimes catastrophic failure of the MOSFETs.

Therefore, the main disadvantage of a class D amplifier is having the "dead time" problem to cause the distortion of the output signal.

In summary, class A amplifiers produce a linearly amplified replica of an input signal, but are inefficient in terms of power usage. The push-pull class B amplifiers provide excellent efficiency (compared to class A amplifiers), but introduce crossover distortion. Class D amplifiers are most efficient compared to class A and class B amplifiers, but there is one significant problem for MOSFET driver circuits in class D amplifiers: the "dead time" that cause the distortion of the output signal.

Accordingly, in light of current state of the art and the drawbacks to current amplifiers mentioned above. A need exits for a switching amplifier that would continue to be highly efficient, that would efficiently and linearly amplify an input signal for generating low-distortion output signals.

SUMMARY OF THE INVENTION

The present invention discloses a switching amplifier that produces a linearly amplified replica of an input signal, is highly efficient, and does not have the "dead time" problem related to class D amplifiers.

One aspect of the present invention provides a method of obtaining an output signal, which is a linearly amplified replica of an input signal having first and second polarities, comprising the steps of: receiving the input signal; pulse modulating the input signal for generating a pulse modulated signal having first and second polarities; switching one or more than one pulsed currents flowing to a first input terminal of a filter according to the pulse modulated signal when the polarity of the pulse modulated signal is positive; switching one or more than one pulsed currents flowing from the first input terminal of the filter according to the pulse modulated signal when the polarity of the pulse modulated signal is negative; filtering the pulsed currents via the filter for getting the output signal.

Yet another aspect of the present invention provides the method further comprising: switching one or more than one pulsed currents flowing from a second input terminal of the filter according to the pulse modulated signal when the polarity of the pulse modulated signal is positive; switching one or more than one pulsed currents flowing to the second input terminal of the filter according to the pulse modulated signal when the polarity of the pulse modulated signal is negative; filtering the pulsed currents via the filter for getting the output signal.

Yet another aspect of the present invention provides the method further comprising: getting a feedback signal by detecting the output signal and integrating the feedback signal to process a negative feedback control.

BRIEF DESCRIPTION OF THE DRAWINGS

The above and other features and advantages of the present general inventive concept will become more apparent by describing in detail exemplary embodiments thereof with reference to the attached drawings in which.

DETAILED DESCRIPTION OF THE PREFERRED EMBODIMENTS

The detailed description set forth below in connection with the appended drawings is intended as a description of presently preferred embodiments of the invention and is not intended to represent the only forms in which the present invention may be constructed and or utilized.

Figure 1:
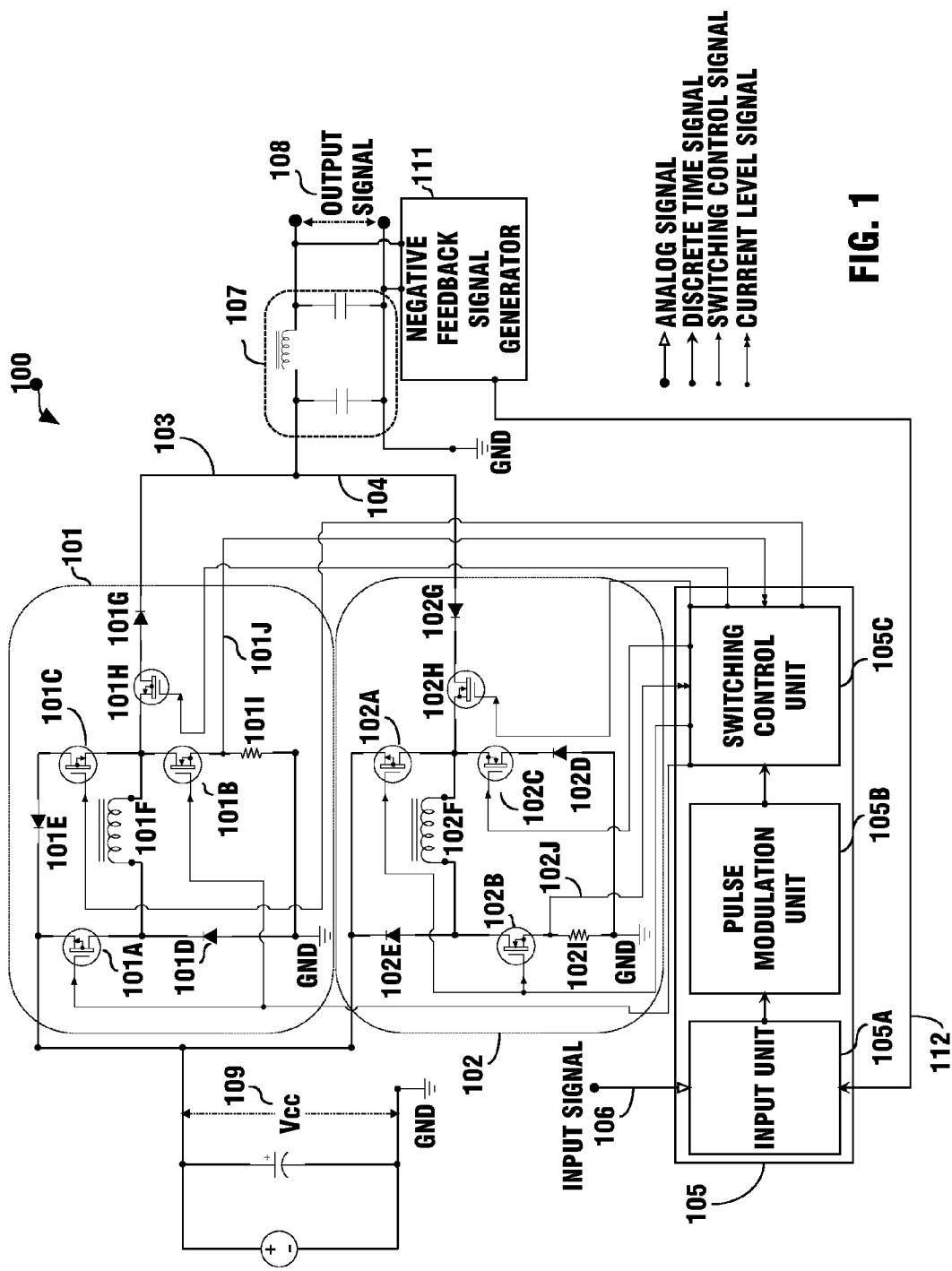
FIG. 1 is an exemplary block and circuit diagram illustrating a first embodiment of a switching amplifier in accordance with present invention, wherein said switching amplifier comprises a pulsed current source unit and a pulsed current sink unit, and the inductance means of said pulsed current source unit and pulsed current sink unit are inductors.

FIG. 1 is an exemplary block and circuit diagram illustrating a first embodiment of a switching amplifier 100 in accordance with present invention, wherein said switching amplifier comprises a pulsed current source unit 101 and a pulsed current sink unit 102, and the inductance means of said pulsed current source unit 101 and pulsed current sink unit 102 are inductors 101F, 102F.

As illustrated in FIG. 1, the switching amplifier 100 of the present invention for amplifying an input signal 106 having positive and negative polarities is comprised of: a pulsed current source unit 101 comprising an inductance means 101F and a plurality of switches 101A, 101B, 101C and 101H for switching a pulsed current from the inductance means 101F to a filter unit 107 when the polarity of the input signal 106 is positive, and a feedback current signal generator 101I to generate a feedback current signal 101J by detecting the current of the inductance means 101F; a pulsed current sink unit 102 comprising an inductance means 102F and a plurality of switches 102A, 102B, 102C and 102H for switching a pulsed current from the filter unit 107 to the inductance means 102F when the polarity of the input signal 106 is negative, and a feedback current signal generator 102I to generate a feedback current signal 102J by detecting the current of the inductance means 102F; an amplifier control unit 105 for receiving the input signal 106, the feedback current signals 101J and 102J, wherein the amplifier control unit 105 couples to the switches 101A, 101B, 101C and 101H of the pulsed current source unit 101 and the switches 102A, 102B, 102C and 102H of the pulsed current sink unit 102 to control their switching according to the input signal 106, the feedback current signals 101J and 102J; the filter unit 107 to obtain an output signal 108 corresponding to the input signal 106 by filtering the output of the pulsed current source unit 101 and the pulsed current sink unit 102 and outputting the output signal 108; wherein the input signal 106 is an analog signal, the inductance means 101F, 102F are inductors, and the filter unit 107 is a low pass filter.

The switching amplifier 100 according to present invention, wherein said plurality of switches of the pulsed current source unit 101 comprises: a first switching unit comprising 101A, 101B coupled between the inductance means 101F and a direct current (DC) voltage 109 for switching a current from the direct current (DC) voltage 109 to the inductance means 101F; a second switching unit comprising 101C, 101D, 101E coupled between the direct current (DC) voltage 109 and the inductance means 101F for switching a current from the inductance means 101F to the direct current (DC) voltage 109; a third switching unit comprising 101D, 101H, 101G coupled between the inductance means 101F and the filter unit 107 for switching the pulsed current 103 from the inductance means 101F to the filter unit 107.

The switching amplifier 100 according to present invention, wherein said plurality of switches of the pulsed current sink unit 102 comprises: a first switching unit comprising 102A, 102B coupled to the inductance means 102F for switching a current from the direct current (DC) voltage 109 to the inductance means 102F; a second switching unit comprising 102C, 102D, 102E coupled between the inductance means 102F and the direct current (DC) voltage 109 for switching a current from the inductance means 102F to the direct current (DC) voltage 109; a third switching unit comprising 102B, 102G, 102H coupled between the inductance means 102F and the filter unit 107 for switching the pulsed current 104 from the filter unit 107 to the inductance means 102F.

In this non-limiting exemplary embodiment, the input signal 106 is an analog signal. And it should be noted that it is obvious for a corresponding embodiment of a switching amplifier in accordance with this invention for an input signal which is a discrete time signal.

As further illustrated in FIG. 1, the amplifier control unit 105 comprises an input unit 105A for receiving the input signal 106 and having an analog to digital converter for converting the input signal 106 to a discrete time input signal x[n]

$$x=\{x[n]\},\ 0<n<\infty;$$

a pulse modulation unit 105B for getting a pulse modulated signal from pulse modulating the discrete time input signal x[n]; and a switching control unit 105C coupled to the switches 101A, 101B, 101C and 101H of the pulsed current source unit 101, the switches 102A, 102B, 102C and 102H of the pulsed current sink unit 102 to control their switching according to the pulse modulated signal from the pulse modulation unit 105B.

In this non-limiting exemplary embodiment 100, the amplifier control unit 105 is a digital signal processing circuit. And it is obvious for a corresponding embodiment of an analog signal processing circuit for the amplifier control unit 105 in accordance with this invention by using an input unit for receiving an analog input signal and a pulse modulator for pulse modulating said analog input signal.

Figure 2:
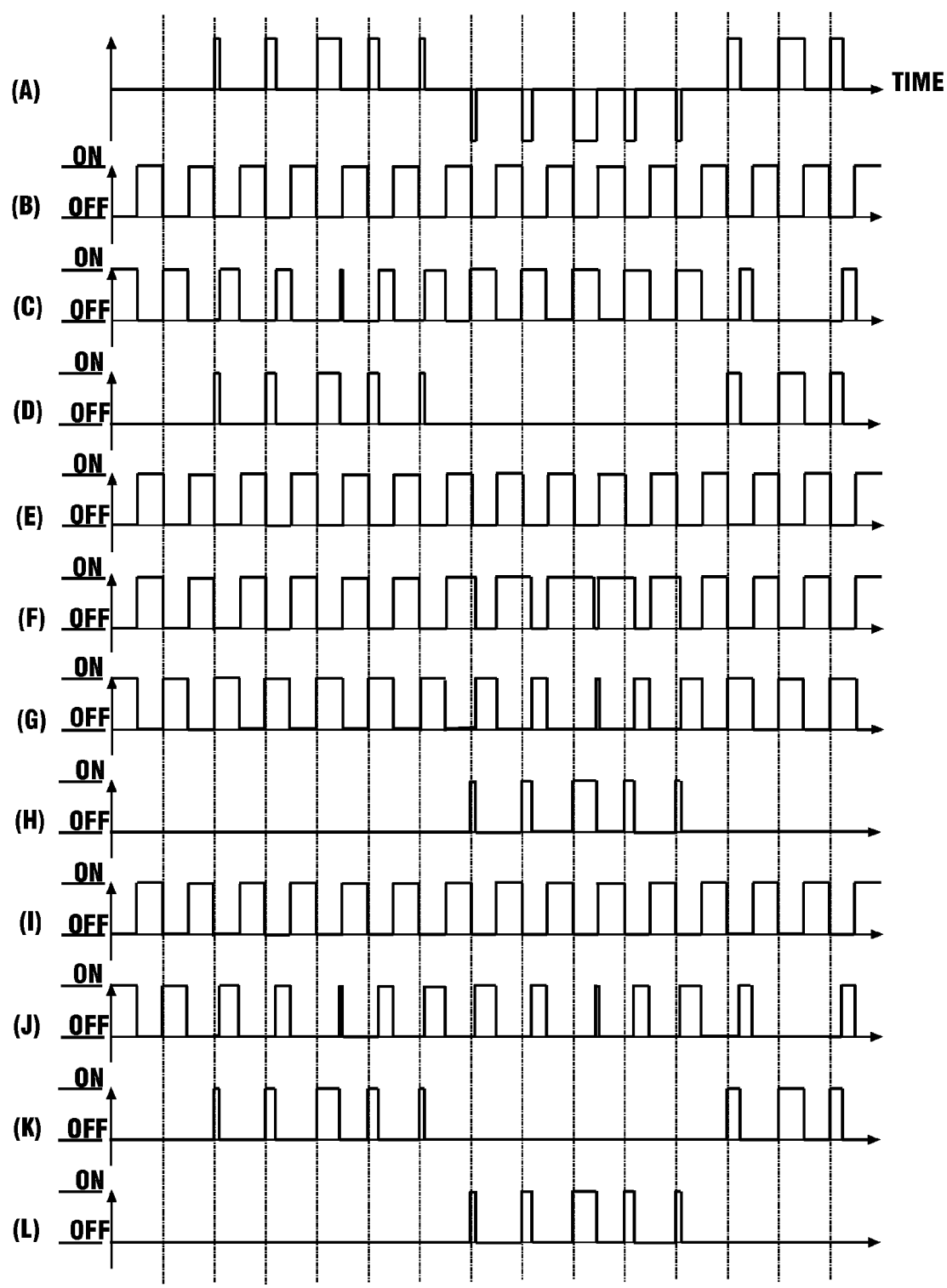
FIG. 2 are exemplary waveform diagrams illustrating the various waveforms at input and output points of a switching control unit of various figures in accordance with the present invention.

FIG. 2 are exemplary waveform diagrams illustrating the various waveforms at input and output points of switching control units in the circuits of various figures in accordance with the present invention.

As illustrated in FIG. 2, a non-limiting exemplary waveform for the pulse modulated signal from the pulse modulation unit 105B is illustrated in FIG. 2(A), since the input signal 106 has first and second polarities; therefore, the pulse modulated signal also has first and second polarities.

According to the pulse modulated signal illustrated in FIG. 2(A), a non-limiting exemplary waveform of switching control signals from the switching control unit 105C to the switches 101A and 101B for controlling their switching are illustrated in FIG. 2(B); a non-limiting exemplary waveform of switching control signal from the switching control unit 105C to the switch 101C for controlling its switching is illustrated in FIG. 2(C). Also according to the pulse modulated signal illustrated in FIG. 2(A), non-limiting exemplary waveforms of switching control signals from the switching control unit 105C to the switch 101H is illustrated in FIG. 2(D).

According to the pulse modulated signal illustrated in FIG. 2(A), a non-limiting exemplary waveform of switching control signal from the switching control unit 105C to the switch 102A for controlling its switching are illustrated in FIG. 2(E); a non-limiting exemplary waveform of switching control signal from the switching control unit 105C to the switch 102B for controlling its switching is illustrated in FIG. 2(F); a non-limiting exemplary waveform of switching control signal from the switching control unit 105C to the switch 102C is illustrated in FIG. 2(G). Also according to the pulse modulated signal illustrated in FIG. 2(A), non-limiting exemplary waveform of switching control signal from the switching control unit 105C to the switch 102H is illustrated in FIG. 2(H).

Accordingly, as illustrated in FIG. 1 and FIG. 2, when the input signal 106 is zero, the switches 101H and 102H are all switched off. The switches 101A, 101B and 101C switch on and off alternately to charge and discharge the inductor 101F to regulate current of the inductor 101F: when the switches 101A, 101B switch on and 101C switches off, the inductor 101F is charging energy from the direct current (DC) voltage 109; and when the switches 101A, 101B switch off and 101C switches on, the energy contained in the inductor 101F is discharged back to the direct current (DC) voltage 109. Therefore, at steady state, for approximately equal charging and discharging time, the energy flow in and out of the inductor 101F are equal during each switching, therefore, this switching keeps the energy stored in the inductor 101F constant. For the inductance of the inductor 101F is large enough and the switching frequency of the switches 101A, 101B and 101C is fast enough, the current flow through the inductor 101F keeps approximately constant since its variation is small enough. The switches 102A, 102B and 102C switch on and off alternately to charge and discharge the inductor 102F to regulate current of the inductor 102F: when the switches 102A, 102B switch on and 102C switches off, the inductor 102F is charging energy from the direct current (DC) voltage 109; and when the switches 102A, 102B switch off and 102C switches on, the energy contained in the inductor 102F is discharged back to the direct current (DC) voltage 109. Therefore, at steady state, for approximately equal charging and discharging time, the energy flow in and out of the inductor 102F are equal during each switching, therefore, this switching keeps the energy stored in the inductor 102F constant. For the inductance of the inductor 102F is large enough and the switching frequency of the switches 102A, 102B and 102C is fast enough, the current flow through the inductor 102F keeps approximately constant since its variation is small enough.

When the input signal 106 is not zero, as illustrated in FIG. 1 and FIG. 2(A)-2(H), the switches 101A, 101B and 101C switch on and off alternately to keep the energy stored in the inductor 101F constant, therefore when the switch 101H switches on, the current 103 from the inductor 101F to the filter 107 keeps constant. Also, the switches 102A, 102B and 102C switch to keep the energy stored in the inductor 102F constant, therefore when the switch 102H switches on, the current 104 flowing from the filter 107 to the inductor 101F keeps constant.

As illustrated in FIG. 1 and FIG. 2(A), 2(B), 2(C), 2(D) the switch 101H switches for conducting the current 103 flowing from the inductor 101F to the filter unit 107. When the polarity of the pulse modulated signal FIG. 2(A) is positive, the switch 101H switches to conduct the current 103 flowing from the inductor 101F to the filter unit 107 according to the pulse modulated signal. Also, as illustrated in FIG. 1 and FIG. 2(A), 2(E), 2(F), 2(G), 2(H) the switch 102H switches for conducting the current 104 flowing from the filter unit 107 to the inductor 102F. When the polarity of the pulse modulated signal FIG. 2(A) is negative, the switch 102H switches to conduct the current flowing from the filter unit 107 to the inductor 102F according to the pulse modulated signal.

As further illustrated in FIG. 1, the filter unit 107 is a low pass filter to obtain the output signal 108 corresponding to the input signal 106 by filtering the pulsed current 103 and 104 and outputting the output signal 108.

As further illustrated in FIG. 1 and FIG. 2, the level of the output signal 108 can be adjusted by control the current level of the inductors 101F and 102F. Based on the current level feedback signals 101J, 102J representing currents flow through the inductors 101F, 102F respectively, the switching control unit 105C can adjust the current flow through the inductors 101F, 102F by changing the duty ratio between the charging and discharging periods of the inductors 101F, 102F according to the current level feedback signals 101J, 102J.

As further illustrated in FIG. 1, the switching amplifier 100 discloses a method of obtaining an output signal 108, which is a linearly amplified replica of an input signal 106 having first and second polarities, comprising the steps of: receiving the input signal 106; pulse modulating the input signal 106 for generating a pulse modulated signal having first and second polarities illustrated in FIG. 2(A); switching the pulsed current 103 flowing to a first input terminal of the filter unit 107 according to the pulse modulated signal illustrated in FIG. 2(A) when the polarity of the pulse modulated signal is positive; switching the pulsed current 104 flowing from the first input terminal of the filter unit 107 according to the pulse modulated signal when the polarity of the pulse modulated signal is negative; filtering the pulsed currents 103, 104 via the filter unit 107 for getting the output signal 108.

As further illustrated in FIG. 1, wherein said switching the pulsed current 103 flowing to the first input terminal of the filter 107 according to the pulse modulated signal illustrated in FIG. 2(A) when the polarity of the pulse modulated signal is positive comprises the steps of: charging the inductance means 101F via switching on a current from the direct current (DC) voltage 109 to the inductance means 101F; discharging the inductance means 101F via switching off the current from the direct current (DC) voltage 109 to the inductance means 101F and switching on the current 103 from the inductance means 101F to the filter 107 for discharging energy stored in the inductance means 101F through the filter 107 to the output signal 108 or switching on a current from the inductance means 101F to the direct current (DC) voltage 109 for discharging energy stored in the inductance means 101F to the direct current (DC) voltage 109 according to the pulse modulated signal when the polarity of the pulse modulated signal is positive, wherein said charging and discharging are controlled according to the feedback current signal 101J corresponding to the current of the inductance means 101F to regulate the current of the inductance means 101F which is an inductor. And said switching the pulsed current 104 flowing from the first input terminal of the filter 107 according to the pulse modulated signal when the polarity of the pulse modulated signal illustrated in FIG. 2(A) is negative comprises the steps of: charging the inductance means 102F via switching on a current from the direct current (DC) voltage 109 to the inductance means 102F; discharging the inductance means 102F via switching off the current from the direct current (DC) voltage 109 to the inductance means 102F and switching on the current 104 from the filter 107 to the inductance means 102F for discharging energy stored in the inductance means 102F through the filter 107 to the output signal 108 or switching on a current from the inductance means 102F to the direct current (DC) voltage 109 for discharging energy stored in the inductance means 102F to the direct current (DC) voltage 109 according to the pulse modulated signal illustrated in FIG. 2(A) when the polarity of the pulse modulated signal is negative, wherein said charging and discharging are controlled according the feedback current signal 102J corresponding to the current of the inductance means 102F to regulate the current of the inductance means 102F which is an inductor.

As further illustrated in FIG. 1, the switching amplifier 100 further comprises a negative feedback signal generator 111 to generate a negative feedback signal 112 corresponding to the output signal 108, wherein the amplifier control unit 105 integrates the input signal 106 and the negative feedback signal 112.

Figure 3:
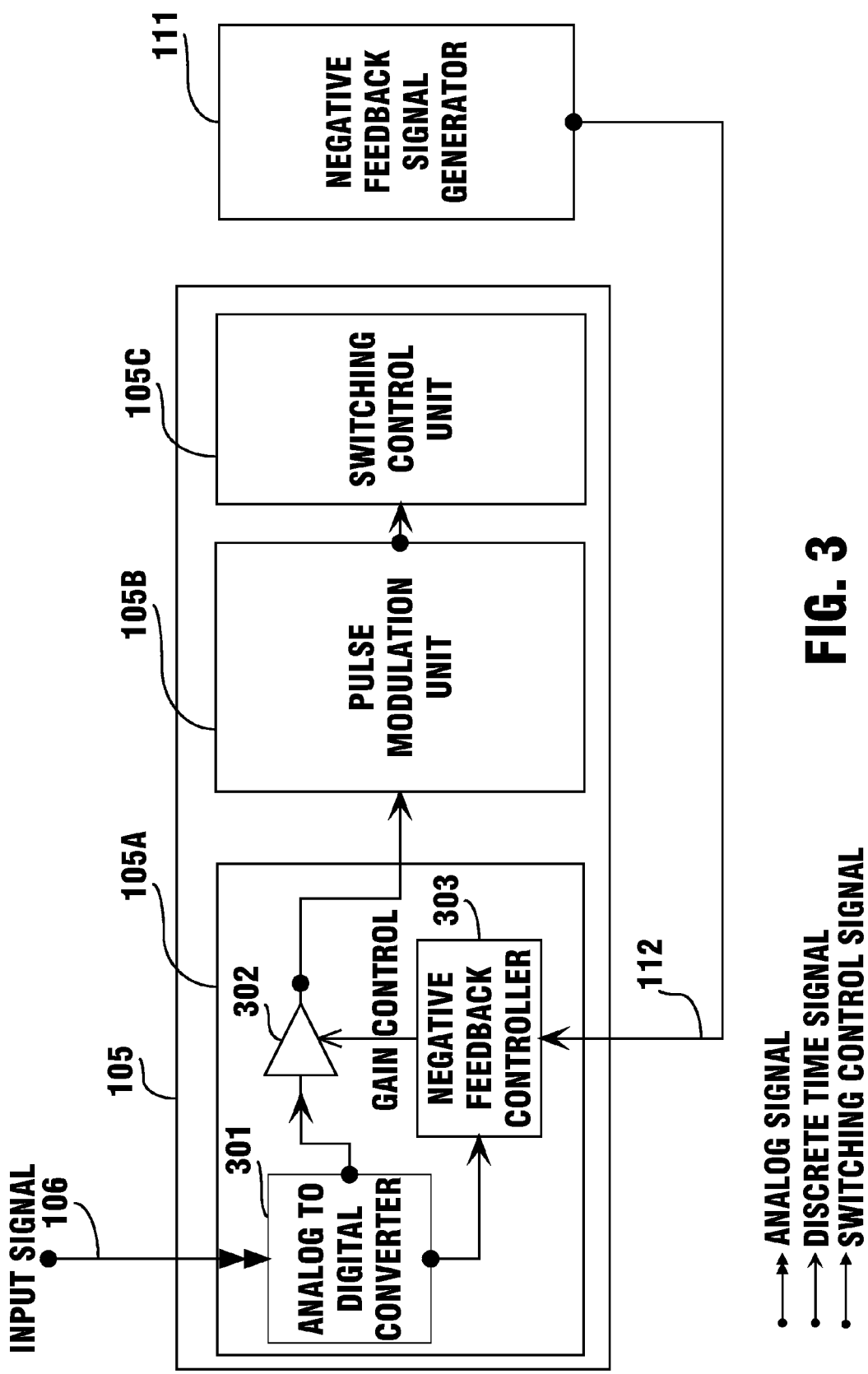
FIG. 3 is an exemplary block and circuit diagram illustrating an embodiment of the amplifier control unit integrating an input signal and a negative feedback signal in FIGS. 1, 4, 5, 6, 7, 8, 9, 10, 11 and 12 in accordance with the present invention.

FIG. 3 is an exemplary block and circuit diagram illustrating an embodiment of the amplifier control unit 105 integrating an input signal 106 and a negative feedback signal 112 in FIG. 1 in accordance with the present invention.

As illustrated in FIG. 3 and FIG. 1, the input unit 105A has an analog to digital converter 301 and further comprises a linear digital transformer 302 and a negative feedback controller 303. Wherein the analog to digital converter 301 receives the input signal 106 and converts the input signal 106 to a discrete time input signal:

$$x=\{x[n]\},\ 0<n<\infty;$$

The linear digital transformer 302 transforms the discrete time input signal x[n] by multiplying a gain G to the discrete time input signal (the default value of the gain G is 1):

$$X[n]=\{G \cdot x[n]\},\ 0<n<\infty$$

to get a compensated discrete time signal X[n] and sends the compensated discrete time signal X[n] to pulse modulation unit 105B.

Accordingly, for the switching amplifier 100 further comprises the negative feedback signal generator 111 to generate the negative feedback signal 112 corresponding to the output signal 108 and the amplifier control unit 105 integrates the input signal 106 and the negative feedback signal 112, the pulse modulation unit 105B receives the compensated discrete time signal X[n].

As further illustrated in FIG. 3, the negative feedback controller 303 receives the discrete time input signal from the analog to digital converter 301 and compares it to the negative feedback signal 112, therefore to adjust the gain G of the linear digital transformer 302 according to the comparison. For example, if the negative feedback signal 112 corresponding to the output signal 108 shows that the output signal 108 is below a required level, then the negative feedback controller 303 will increase the gain G of the linear digital transformer 302 to increase the output signal 108, wherein said required level is obtained according to the discrete time input signal.

In this non-limiting exemplary embodiment 100, the amplifier control unit 105 is a digital signal processing circuit. And it is obvious for a corresponding embodiment of an analog signal processing circuit for the amplifier control unit 105 in accordance with this invention by using an analog input unit for receiving an analog input signal, a programmable gain amplifier for amplifying the an analog input signal and a pulse modulator for pulse modulating said amplified analog signal.

Figure 4:
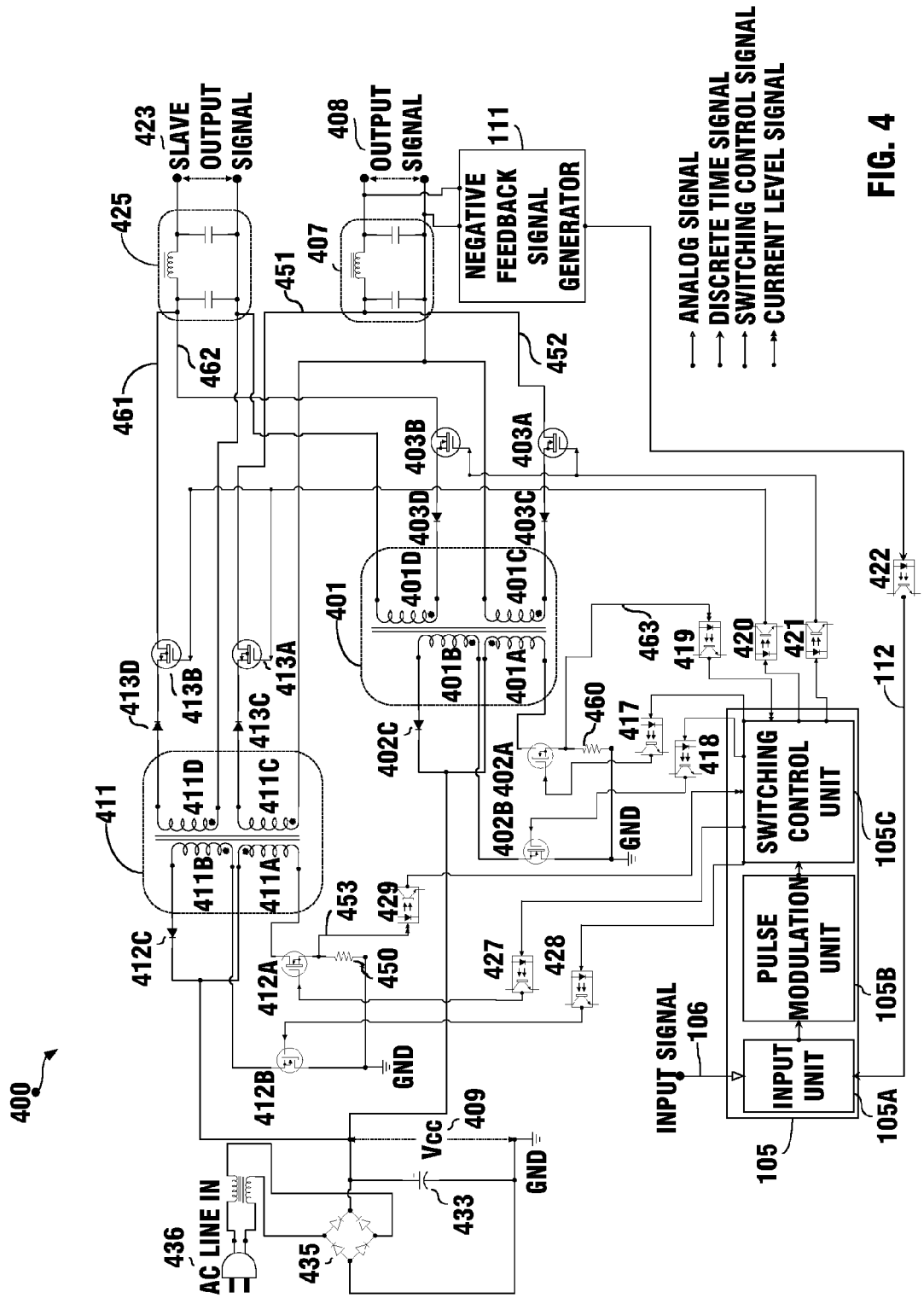
FIG. 4 is an exemplary block and circuit diagram illustrating a second embodiment of a switching amplifier in accordance with present invention, wherein said switching amplifier comprises a pulsed current source unit and a pulsed current sink unit, and the inductance means of said pulsed current source unit and pulsed current sink unit supply are flyback transformers.

FIG. 4 is an exemplary block and circuit diagram illustrating a second embodiment of a switching amplifier 400 in accordance with present invention, wherein said switching amplifier 400 comprises a pulsed current source unit comprising 411, 412A, 412B, 412C, 413A, 413C, 450 and a pulsed current sink unit comprising 401, 402A, 402B, 402C, 403A, 403C, 460, and the inductance means of said pulsed current source unit and pulsed current sink unit supply are flyback transformers 401, 411.

As illustrated in FIG. 4, the switching amplifier 400 of the present invention for amplifying an input signal 106 having positive and negative polarities is comprised of: a pulsed current source unit comprising the flyback transformer 411 and a plurality of switches 412A, 412B, 412C, 413A for switching a pulsed current 451 from the flyback transformer 411 to a filter unit 407 when the polarity of the input signal 106 is positive, and a feedback current signal generator 450 to generate a feedback current signal 453 by detecting the current of the primary winding 411A of the flyback transformer 411; a pulsed current sink unit comprising the flyback transformer 401 and a plurality of switches 401A, 401B, 401C and 403A for switching a pulsed current from the filter unit 407 to the flyback transformer 401 when the polarity of the input signal 106 is negative, and a feedback current signal generator 460 to generate a feedback current signal 463 by detecting the current of the primary winding 401A of the flyback transformer 401; an amplifier control unit 105 for receiving the input signal 106, the feedback current signals 453 and 463, wherein the amplifier control unit 105 couples to the switches 412A, 412B, 413A of the pulsed current source unit and the switches 402A, 402B, 403A of the pulsed current sink unit to control their switching according to the input signal 106, the feedback current signals 453, 463; the filter unit 407 to obtain an output signal 408 corresponding to the input signal 106 by filtering the pulsed current 451 and the pulsed current 452 and outputting the output signal 408; wherein the input signal 106 is an analog signal and the filter unit 407 is a low pass filter.

The switching amplifier 400 according to present invention, wherein said plurality of switches of the pulsed current source unit comprises: a first switching unit comprising 412A coupled to the primary winding 411A of the flyback transformer 411 for switching a current from the direct current (DC) voltage 409 to the winding 411A; a second switching unit comprising 412B, 412C coupled to a winding 411B of the flyback transformer 411 for switching a current from the winding 411B to the direct current (DC) voltage 409; a third switching unit comprising 413A coupled between a winding 411C of the flyback transformer 411 and the filter unit 407 for switching the pulsed current 451 from the winding 411C to the filter unit 407.

The switching amplifier 400 according to present invention, wherein said plurality of switches of the pulsed current sink unit comprises: a first switching unit comprising 402A coupled to the primary winding 401A of the flyback transformer 401 for switching a current from the direct current (DC) voltage 409 to the winding 401A; a second switching unit comprising 402B, 402C coupled to a winding 401B of the flyback transformer 401 for switching a current from the winding 401B to the direct current (DC) voltage 409; a third switching unit comprising 403A coupled between a winding 401C of the flyback transformer 401 and the filter unit 407 for switching the pulsed current 452 from the filter unit 407 to the winding 401C.

In this non-limiting exemplary embodiment, the input signal 106 is an analog signal. And it should be noted that it is obvious for a corresponding embodiment of a switching amplifier in accordance with this invention for an input signal which is a discrete time signal.

As further illustrated in FIG. 4, the amplifier control unit 105 comprises an input unit 105A for receiving the input signal 106 and having an analog to digital converter for converting the input signal 106 to a discrete time input signal x[n]

$$x=\{x[n]\},\ 0<n<\infty;$$

a pulse modulation unit 105B for getting a pulse modulated signal from pulse modulating the discrete time input signal x[n]; and a switching control unit 105C coupled to the switches 412A, 412B, 413A of the pulsed current source unit, the switches 402A, 402B, 403A of the pulsed current sink unit to control their switching according to the pulse modulated signal from the pulse modulation unit 105B.

In this non-limiting exemplary embodiment 400, the amplifier control unit 105 is a digital signal processing circuit. And it is obvious for a corresponding embodiment of an analog signal processing circuit for the amplifier control unit 105 in accordance with this invention by using an input unit for receiving an analog input signal and a pulse modulator for pulse modulating said analog input signal.

FIG. 2 are exemplary waveform diagrams illustrating the various waveforms at input and output points of switching control units in the circuits of various figures in accordance with the present invention.

As illustrated in FIG. 2, a non-limiting exemplary waveform for the pulse modulated signal from the pulse modulation unit 105B is illustrated in FIG. 2(A), since the input signal 106 has first and second polarities; therefore, the pulse modulated signal also has first and second polarities.

According to the pulse modulated signal illustrated in FIG. 2(A), a non-limiting exemplary waveform of switching control signals from the switching control unit 105C to the switches 412A for controlling its switching is illustrated in FIG. 2(B); a non-limiting exemplary waveform of switching control signal from the switching control unit 105C to the switch 412B for controlling its switching is illustrated in FIG. 2(C). Also according to the pulse modulated signal illustrated in FIG. 2(A), non-limiting exemplary waveforms of switching control signals from the switching control unit 105C to the switches 413A, 413B is illustrated in FIG. 2(D).

According to the pulse modulated signal illustrated in FIG. 2(A), a non-limiting exemplary waveform of switching control signal from the switching control unit 105C to the switch 402A for controlling its switching are illustrated in FIG. 2(E); a non-limiting exemplary waveform of switching control signal from the switching control unit 105C to the switch 402B is illustrated in FIG. 2(G). Also according to the pulse modulated signal illustrated in FIG. 2(A), non-limiting exemplary waveform of switching control signal from the switching control unit 105C to the switches 403A, 403B is illustrated in FIG. 2(H).

Accordingly, as illustrated in FIG. 4 and FIG. 2, when the input signal 106 is zero, the switches 413A and 403A are all switched off. The switches 412A, 412B switch on and off alternately to charge and discharge the flyback transformer 411 to regulate energy stored in the flyback transformer 411: when the switch 412A switches on and 412B switches off, the flyback transformer 411 is charging energy from the direct current (DC) voltage 409; and when the switch 412A switches off and 412B switches on, the energy contained in the flyback transformer 411 is discharged back to the direct current (DC) voltage 409. Therefore, at steady state, for approximately equal charging and discharging time, the energy flow in and out of the flyback transformer 411 are equal during each switching, therefore, this switching keeps the energy stored in the flyback transformer 411 constant. For the inductance of the flyback transformer 411 is large enough and the switching frequency of the switches 412A, 412B is fast enough, the current flow through the flyback transformer 411 keeps approximately constant since its variation is small enough. The switches 402A, 402B switch on and off alternately to charge and discharge the flyback transformer 401 to regulate current of the flyback transformer 401: when the switch 402A switches on and 402B switches off, the flyback transformer 401 is charging energy from the direct current (DC) voltage 409; and when the switch 402A switches off and 402B switches on, the energy contained in flyback transformer 401 is discharged back to the direct current (DC) voltage 409. Therefore, at steady state, for approximately equal charging and discharging time, the energy flow in and out of the flyback transformer 401 are equal during each switching, therefore, this switching keeps the energy stored in the flyback transformer 401 constant. For the inductance of the flyback transformer 401 is large enough and the switching frequency of the switches 402A, 402B is fast enough, the current flow through the flyback transformer 401 keeps approximately constant since its variation is small enough.

When the input signal 106 is not zero, as illustrated in FIG. 4 and FIG. 2(A)~2(H), the switches 412A, 412B and 413A switch on and off alternately to keep the energy stored in the flyback transformer 411 constant, therefore when the switch 413 switches on, the current 451 from the flyback transformer 411 to the filter 407 keeps constant. Also, the switches 402A, 402B and 403A switch to keep the energy stored in the flyback transformer 401 constant, therefore when the switch 403A switches on, the current 452 flowing from the filter 407 to the flyback transformer 401 keeps constant.

As illustrated in FIG. 4 and FIG. 2(A), 2(B), 2(C), 2(D) the switch 413A switches for conducting the current 451 flowing from the flyback transformer 411 to the filter unit 407. When the polarity of the pulse modulated signal FIG. 2(A) is positive, the switch 413A switches to conduct the current 451 flowing from the flyback transformer 411 to the filter unit 407 according to the pulse modulated signal. Also, as illustrated in FIG. 4 and FIG. 2(A), 2(E), 2(G), 2(H) the switch 403A switches for conducting the current 452 flowing from the filter unit 407 to the flyback transformer 401. When the polarity of the pulse modulated signal FIG. 2(A) is negative, the switch 403A switches to conduct the current 452 flowing from the filter unit 407 to the flyback transformer 401 according to the pulse modulated signal.

As further illustrated in FIG. 4, the filter unit 407 is a low pass filter to obtain the output signal 408 corresponding to the input signal 106 by filtering the pulsed current 451 and 452 and outputting the output signal 408.

As further illustrated in FIG. 4 and FIG. 2, the level of the output signal 108 can be adjusted by control the current level of the flyback transformer 401 and 411. Based on the current level feedback signals 453, 463 representing currents flow through the flyback transformer 411, 401 respectively, the switching control unit 105C can adjust the current flow through the flyback transformer 411, 401 by changing the duty ratio between the charging and discharging periods of the flyback transformer 411, 401 according to the current level feedback signals 453, 463.

As further illustrated in FIG. 4, the switching amplifier 400 discloses a method of obtaining the output signal 408, which is a linearly amplified replica of the input signal 106 having first and second polarities, comprising the steps of: receiving the input signal 106; pulse modulating the input signal 106 for generating a pulse modulated signal having first and second polarities illustrated in FIG. 2(A); switching the pulsed current 451 flowing to a first input terminal of the filter unit 407 according to the pulse modulated signal illustrated in FIG. 2(A) when the polarity of the pulse modulated signal is positive; switching the pulsed current 452 flowing from the first input terminal of the filter unit 407 according to the pulse modulated signal when the polarity of the pulse modulated signal is negative; filtering the pulsed currents 451, 452 via the filter unit 407 for getting the output signal 408.

As further illustrated in FIG. 4, wherein said switching the pulsed current 451 flowing to the first input terminal of the filter 407 according to the pulse modulated signal illustrated in FIG. 2(A) when the polarity of the pulse modulated signal is positive comprises the steps of: charging the flyback transformer 411 via switching on a current from the direct current (DC) voltage 409 to the flyback transformer 411; discharging the flyback transformer 411 via switching off the current from the direct current (DC) voltage 409 to the flyback transformer 411 and switching on the current 451 from the flyback transformer 411 to the filter 407 for discharging energy stored in the flyback transformer 411 through the filter 407 to the output signal 408 or switching on a current from the flyback transformer 411 to the direct current (DC) voltage 409 for discharging energy stored in flyback transformer 411 to the direct current (DC) voltage 409 according to the pulse modulated signal when the polarity of the pulse modulated signal is positive, wherein said charging and discharging are controlled according to the feedback current signal 453 corresponding to the current of the flyback transformer 411 to regulate the current of the flyback transformer 411. And said switching the pulsed current 452 flowing from the first input terminal of the filter 407 according to the pulse modulated signal when the polarity of the pulse modulated signal illustrated in FIG. 2(A) is negative comprises the steps of: charging the flyback transformer 401 via switching on a current from the direct current (DC) voltage 409 to the flyback transformer 401; discharging the flyback transformer 401 via switching off the current from the direct current (DC) voltage 409 to the flyback transformer 401 and switching on the current 452 from the filter 407 to the flyback transformer 401 for discharging energy stored in the flyback transformer 401 through the filter 407 to the output signal 408 or switching on a current from the flyback transformer 401 to the direct current (DC) voltage 409 for discharging energy stored in the flyback transformer 401 to the direct current (DC) voltage 409 according to the pulse modulated signal illustrated in FIG. 2(A) when the polarity of the pulse modulated signal is negative, wherein said charging and discharging are controlled according the feedback current signal 463 corresponding to the current of the flyback transformer 401 to regulate the current of the flyback transformer 401.

As further illustrated in FIG. 4, the switching amplifier 400 further comprises a negative feedback signal generator 111 to generate a negative feedback signal corresponding to the output signal 408, wherein the amplifier control unit 105 integrates the input signal 106 and the negative feedback signal 112.

FIG. 3 is an exemplary block and circuit diagram illustrating an embodiment of the amplifier control unit 105 integrating an input signal 106 and a negative feedback signal 112 in FIG. 4 in accordance with the present invention.

As illustrated in FIG. 3 and FIG. 4, the input unit 105A has an analog to digital converter 301 and further comprises a linear digital transformer 302 and a negative feedback controller 303. Wherein the analog to digital converter 301 receives the input signal 106 and converts the input signal 106 to a discrete time input signal:

$$x=\{x[n]\},\ 0<n<\infty;$$

The linear digital transformer 302 transforms the discrete time input signal x[n] by multiplying a gain G to the discrete time input signal (the default value of the gain G is 1):

$$X[n]=\{G \times x[n]\}, 0<n<\infty$$

to get a compensated discrete time signal X[n] and sends the compensated discrete time signal X[n] to pulse modulation unit 105B.

Accordingly, for the switching amplifier 100 further comprises the negative feedback signal generator 111 to generate the negative feedback signal 112 corresponding to the output signal 408 and the amplifier control unit 105 integrates the input signal 106 and the negative feedback signal 112, the pulse modulation unit 105B receives the compensated discrete time signal X[n].

As further illustrated in FIG. 3, the negative feedback controller 303 receives the discrete time input signal from the analog to digital converter 301 and compares it to the negative feedback signal 112, therefore to adjust the gain G of the linear digital transformer 302 according to the comparison. For example, if the negative feedback signal 112 corresponding to the output signal 408 shows that the output signal 408 is below a required level, then the negative feedback controller 303 will increase the gain G of the linear digital transformer 302 to increase the output signal 408, wherein said required level is obtained according to the discrete time input signal.

In this non-limiting exemplary embodiment 400, the amplifier control unit 105 is a digital signal processing circuit. And it is obvious for a corresponding embodiment of an analog signal processing circuit for the amplifier control unit 105 in accordance with this invention by using an analog input unit for receiving an analog input signal, a programmable gain amplifier for amplifying the an analog input signal and a pulse modulator for pulse modulating said amplified analog signal.

The switching amplifier 400 according to the present invention further comprising: isolator circuits 417, 418, 427, 428 coupled between the switches 402A, 402B, 412A, 412B of the pulsed current supply unit and the amplifier control unit 105 to provide electric isolation between them.

The switching amplifier 400 according to the present invention further comprising: isolator circuits 420, 421 coupled between the switches 403A, 403B, 413A, 413B and the amplifier control unit 105 to provide electric isolation between them.

The switching amplifier 400 according to the present invention further comprising: isolator circuits 422 coupled between the negative feedback signal generator 111 and the amplifier control unit 105 to provide electric isolation between them.

The switching amplifier 400 according to the present invention further comprising: each of the flyback transformers 401, 411 further comprising one slave output winding unit that each slave winding unit comprises the slave output winding 401D, 411D; the switches 403B, 413B; and the diodes 403D, 413D and their corresponding filters 425 coupled to the slave output winding units of the flyback transformers 401, 411 for getting or more than one slave output signals 423 corresponding to the input signal.

The switching amplifier 400 according to the present invention further comprising: a rectifying and smoothing unit comprising a full bridge rectifier 435 and a capacitor 433 to rectify and smooth an alternating current (AC) voltage 436 and to provide the direct current (DC) voltage 409.

Figure 5:
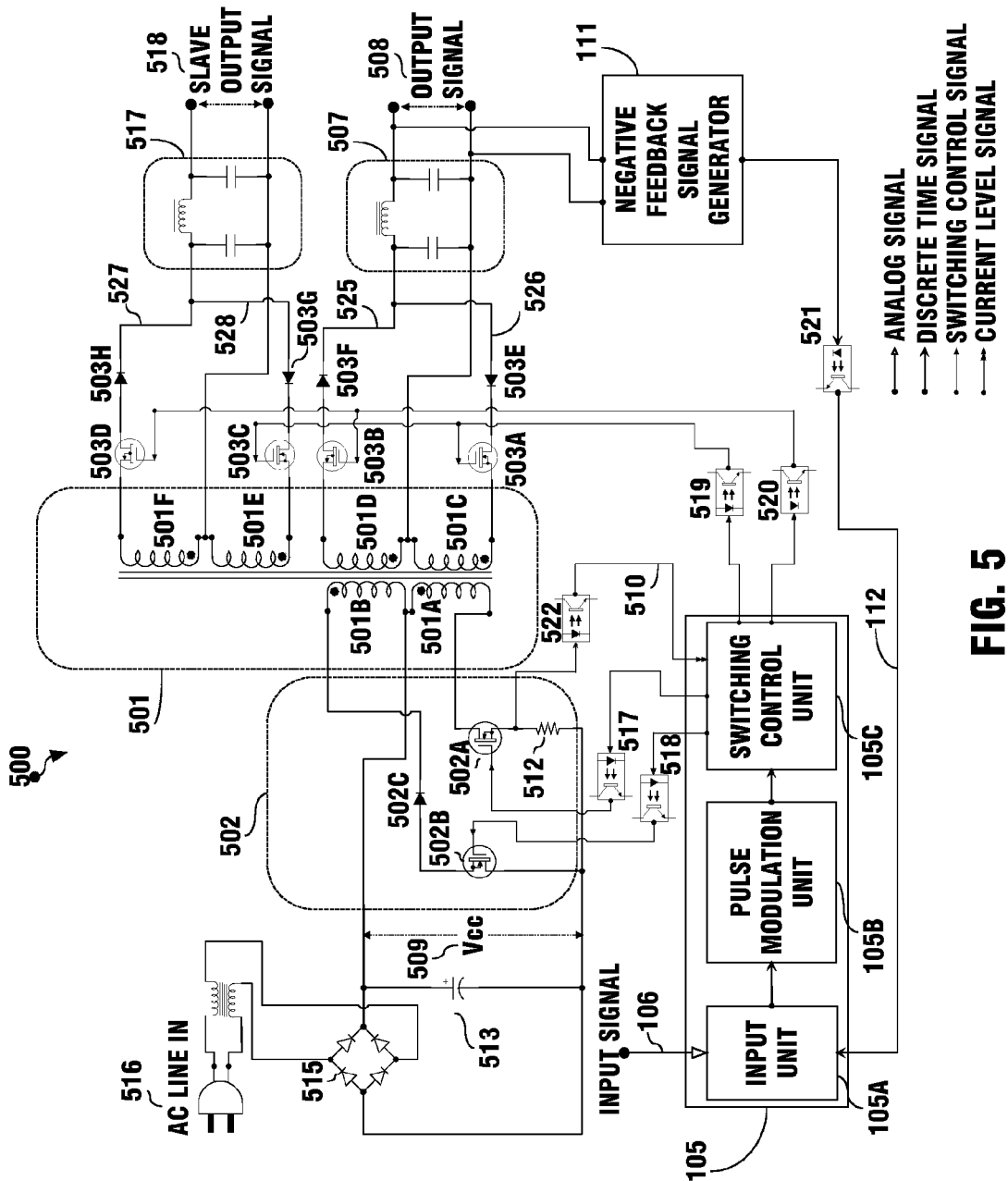
FIG. 5 is an exemplary block and circuit diagram illustrating a third embodiment of a switching amplifier in accordance with present invention, wherein said switching amplifier comprises a pulsed current supply unit comprising a flyback transformer and a plurality of switches for switching a first pulsed current from the flyback transformer to a filter unit when the polarity of the input signal is positive; and for switching a second pulsed current from the filter unit to the flyback transformer when the polarity of the input signal is negative, wherein the flyback transformer has a discharging winding for discharging energy stored in the flyback transformer to a direct current (DC) voltage supply rail.

FIG. 5 is an exemplary block and circuit diagram illustrating a third embodiment of a switching amplifier 500 in accordance with present invention, wherein said switching amplifier 500 comprises a pulsed current supply unit comprising a flyback transformer 501 and a plurality of switches 502, 503A~503D for switching a first pulsed current 525 from the flyback transformer 501 to a filter unit 507 when the polarity of the input signal 106 is positive; and for switching a second pulsed current 526 from the filter unit 507 to the flyback transformer 501 when the polarity of the input signal 106 is negative, wherein the flyback transformer 501 has a discharging winding 501B for discharging energy stored in the flyback transformer 501 to a direct current (DC) voltage supply rail 509.

As illustrated in FIG. 5, the switching amplifier 500 of the present invention for amplifying an input signal 106 having positive and negative polarities is comprised of: a pulsed current supply unit comprising the flyback transformer 501, a plurality of switches for switching a first pulsed current 525 from the flyback transformer 501 to the filter unit 507 when the polarity of the input signal 106 is positive; and for switching a second pulsed current 526 from the filter unit 507 to the flyback transformer 501 when the polarity of the input signal 106 is negative and a feedback current signal generator 512 to generate a feedback current signal 510 by detecting the current of the flyback transformer 501; an amplifier control unit 105 for receiving the input signal 106 and the feedback current signal 510, wherein the amplifier control unit couples to the switches 502A, 502B, 503A~503D of the pulsed current supply unit to control their switching according to the input signal 106 and the feedback current signal 510; the filter unit 507 to obtain an output signal 508 corresponding to the input signal 106 by filtering the output pulsed currents 525, 526 of the pulsed current supply unit and outputting the output signal 508; wherein the input signal 106 is an analog signal, and the filter unit 507 is a low pass filter.

The switching amplifier 500 according to present invention, wherein said flyback transformer 501 comprises: a primary winding 501A for charging the flyback transformer 501 via switching on a current from a direct current (DC) voltage 509 to the primary winding 501A, a winding 501B for discharging energy from the flyback transformer 501 to the direct current (DC) voltage 509; an output winding unit comprising two output windings 501C, 501D for discharging energy from the flyback transformer 501 through the filter 507 to the output signal 508; and wherein the switches comprises: a first switching unit 502A coupled to the primary winding 501A for switching a current from the direct current (DC) voltage 509 to the primary winding 501A; a second switching unit 502B, 502C coupled to the flyback transformer 501 for discharging energy from the flyback transformer 501 to the direct current (DC) voltage 509; a third switching unit 503A, 503B coupled between the output winding unit 501C, 501D and the filter unit 507 for switching the first pulsed current 525 from the flyback transformer 501 to a filter unit 507 when the polarity of the input signal 106 is positive; and for switching the second pulsed current 526 from the filter unit 507 to the flyback transformer 501 when the polarity of the input signal 106 is negative.

In this non-limiting exemplary embodiment, the input signal 106 is an analog signal. And it should be noted that it is obvious for a corresponding embodiment of a switching amplifier in accordance with this invention for an input signal which is a discrete time signal.

As further illustrated in FIG. 5, the amplifier control unit 105 comprises an input unit 105A for receiving the input signal 106 and having an analog to digital converter for converting the input signal 106 to a discrete time input signal x[n]

$$x=\{x[n]\}, 0<n<\infty;$$

a pulse modulation unit 105B for getting a pulse modulated signal from pulse modulating the discrete time input signal x[n]; and a switching control unit 105C coupled to the switches 502A, 502B, 503A, 503B control their switching according to the pulse modulated signal from the pulse modulation unit 105B.

In this non-limiting exemplary embodiment 500, the amplifier control unit 105 is a digital signal processing circuit. And it is obvious for a corresponding embodiment of an analog signal processing circuit for the amplifier control unit 105 in accordance with this invention by using an input unit for receiving an analog input signal and a pulse modulator for pulse modulating said analog input signal.

FIG. 2 are exemplary waveform diagrams illustrating the various waveforms at input and output points of switching control units in the circuits of various figures in accordance with the present invention.

As illustrated in FIG. 2, a non-limiting exemplary waveform for the pulse modulated signal from the pulse modulation unit 105B is illustrated in FIG. 2(A), since the input signal 106 has first and second polarities; therefore, the pulse modulated signal also has first and second polarities.

According to the pulse modulated signal illustrated in FIG. 2(A), a non-limiting exemplary waveform of switching control signals from the switching control unit 105C to the switches 502A for controlling its switching is illustrated in FIG. 2(I); a non-limiting exemplary waveform of switching control signal from the switching control unit 105C to the switch 502B for controlling its switching is illustrated in FIG. 2(J). Also according to the pulse modulated signal illustrated in FIG. 2(A), non-limiting exemplary waveforms of switching control signals from the switching control unit 105C to the switches 503B and 503A are illustrated in FIG. 2(K) and FIG. 2(L), respectively.

Accordingly, as illustrated in FIG. 5 and FIG. 2, when the input signal 106 is zero, the switches 503A and 503B are all switched off. The switches 502A, 502B switch on and off alternately to charge and discharge the flyback transformer 501 to regulate energy stored in the flyback transformer 501: when the switch 502A switches on and 502B switches off, the flyback transformer 501 is charging energy from the direct current (DC) voltage 509; and when the switch 502A switches off and 502B switches on, the energy contained in the flyback transformer 501 is discharged back to the direct current (DC) voltage 509. Therefore, at steady state, for approximately equal charging and discharging time, the energy flow in and out of the flyback transformer 501 are equal during each switching, therefore, this switching keeps the energy stored in the flyback transformer 501 constant. For the inductance of the flyback transformer 501 is large enough and the switching frequency of the switches 502A, 502B is fast enough, the current flow through the flyback transformer 501 keeps approximately constant since its variation is small enough.

When the input signal 106 is not zero, as illustrated in FIG. 5 and FIG. 2(A), FIGS. 2(I)–2(L), the switches 502A, 502B, 503A and 503B switch on and off alternately to keep the energy stored in the flyback transformer 501 constant, therefore when the switch 503B switches on, the current 525 from the flyback transformer 501 to the filter 507 keeps constant. Also, when the switch 503A switches on, the current 526 from the filter 507 to the flyback transformer 501 keeps constant.

As illustrated in FIG. 5 and FIG. 2(A), 2(I), 2(J), 2(K) the switch 503B switches for conducting the current 525 flowing from the flyback transformer 501 to the filter unit 507. When the polarity of the pulse modulated signal FIG. 2(A) is positive, the switch 503B switches to conduct the current 525 flowing from the flyback transformer 501 to the filter unit 507 according to the pulse modulated signal. Also, as illustrated in FIG. 5 and FIG. 2(A), 2(I), 2(J), 2(L) the switch 503A switches for conducting the current 526 flowing from the filter unit 507 to the flyback transformer 501. When the polarity of the pulse modulated signal FIG. 2(A) is negative, the switch 503A switches to conduct the current 526 flowing from the filter unit 507 to the flyback transformer 501 according to the pulse modulated signal.

As further illustrated in FIG. 5, the filter unit 507 is a low pass filter to obtain the output signal 508 corresponding to the input signal 106 by filtering the pulsed current 525 and 526 and outputting the output signal 508.

As further illustrated in FIG. 5 and FIG. 2, the level of the output signal 508 can be adjusted by control the current level of the flyback transformer 501. Based on the current level feedback signals 510 representing current flow through the flyback transformer 501, the switching control unit 105C can adjust the current flow through the flyback transformer 501 by changing the duty ratio between the charging and discharging periods of the flyback transformer 501 according to the current level feedback signals 510.

As further illustrated in FIG. 5, the switching amplifier 500 discloses a method of obtaining the output signal 508, which is a linearly amplified replica of the input signal 106 having first and second polarities, comprising the steps of: receiving the input signal 106; pulse modulating the input signal 106 for generating a pulse modulated signal having first and second polarities illustrated in FIG. 2(A); switching the pulsed current 525 flowing to a first input terminal of the filter unit 507 according to the pulse modulated signal illustrated in FIG. 2(A) when the polarity of the pulse modulated signal is positive; switching the pulsed current 526 flowing from the first input terminal of the filter unit 507 according to the pulse modulated signal when the polarity of the pulse modulated signal is negative; filtering the pulsed currents 525, 526 via the filter unit 507 for getting the output signal 508.

As further illustrated in FIG. 5, wherein said switching pulsed current 525 flowing to the first input terminal of the filter 507 according to the pulse modulated signal illustrated in FIG. 2(A) when the polarity of the pulse modulated signal is positive and switching pulsed currents 526 flowing from the first input terminal of the filter 507 according to the pulse modulated signal illustrated in FIG. 2(A) when the polarity of the pulse modulated signal is negative comprises the steps of: charging the flyback transformer 501 via switching on a current from a direct current (DC) voltage 509 to a primary winding 501A of the flyback transformer 501, wherein the flyback transformer 501 further comprises means 501B for discharging energy stored in the flyback transformer 501 to the direct current (DC) voltage 509; and an output winding unit comprising output windings 501C, 501D for discharging energy stored in the flyback transformer 501 through the filter 507 to the output signal 508; discharging the flyback transformer 501 via switching off the current from the direct current (DC) voltage 509 to the primary winding 501A and switching on a current from the output winding 501D to the filter 507 for getting the first pulsed current 525 or switching on a current from the filter 507 to the output winding 501C for getting the second pulsed current 526, or switching on a current from the flyback transformer 501 to the direct current (DC) voltage 509 for discharging energy stored in the flyback transformer 501 to the direct current (DC) voltage 509; wherein said charging and discharging are controlled according to a feedback current signal 510 corresponding to the current of the primary winding 501A to regulate energy stored in the flyback transformer 501.

As further illustrated in FIG. 5, the switching amplifier 500 further comprises a negative feedback signal generator 111 to generate a negative feedback signal corresponding to the output signal 508, wherein the amplifier control unit 105 integrates the input signal 106 and the negative feedback signal 112.

FIG. 3 is an exemplary block and circuit diagram illustrating an embodiment of the amplifier control unit 105 integrating an input signal 106 and a negative feedback signal 112 in FIG. 5 in accordance with the present invention.

As illustrated in FIG. 3 and FIG. 5, the input unit 105A has an analog to digital converter 301 and further comprises a linear digital transformer 302 and a negative feedback controller 303. Wherein the analog to digital converter 301 receives the input signal 106 and converts the input signal 106 to a discrete time input signal:

$$x=\{x[n]\},\ 0<n<\infty;$$

The linear digital transformer 302 transforms the discrete time input signal x[n] by multiplying a gain G to the discrete time input signal (the default value of the gain G is 1):

$$X[n]=\{G\times x[n]\},\ 0<n<\infty$$

to get a compensated discrete time signal X[n] and sends the compensated discrete time signal X[n] to pulse modulation unit 105B.

Accordingly, for the switching amplifier 100 further comprises the negative feedback signal generator 111 to generate the negative feedback signal 112 corresponding to the output signal 508 and the amplifier control unit 105 integrates the input signal 106 and the negative feedback signal 112, the pulse modulation unit 105B receives the compensated discrete time signal X[n].

As further illustrated in FIG. 3, the negative feedback controller 303 receives the discrete time input signal from the analog to digital converter 301 and compares it to the negative feedback signal 112, therefore to adjust the gain G of the linear digital transformer 302 according to the comparison. For example, if the negative feedback signal 112 corresponding to the output signal 508 shows that the output signal 508 is below a required level, then the negative feedback controller 303 will increase the gain G of the linear digital transformer 302 to increase the output signal 508, wherein said required level is obtained according to the discrete time input signal.

In this non-limiting exemplary embodiment 500, the amplifier control unit 105 is a digital signal processing circuit. And it is obvious for a corresponding embodiment of an analog signal processing circuit for the amplifier control unit 105 in accordance with this invention by using an analog input unit for receiving an analog input signal, a programmable gain amplifier for amplifying the an analog input signal and a pulse modulator for pulse modulating said amplified analog signal.

The switching amplifier 500 according to the present invention further comprising: isolator circuits 517, 518 coupled between the switches 502A, 502B of the pulsed current supply unit and the amplifier control unit 105 to provide electric isolation between them.

The switching amplifier 500 according to the present invention further comprising: isolator circuits 519, 520 coupled between the switches 503A, 503B and the amplifier control unit 105 to provide electric isolation between them.

The switching amplifier 500 according to the present invention further comprising: isolator circuits 521 coupled between the negative feedback signal generator 111 and the amplifier control unit 105 to provide electric isolation between them.

The switching amplifier 500 according to the present invention further comprising: the flyback transformer 501 further comprising one slave output winding unit comprising slave output winding 501E, 501F; switches 503C, 503D and their corresponding filters 517 coupled to the slave output winding units of the flyback transformer 501 for getting a slave output signal 518 corresponding to the input signal 106.

The switching amplifier 500 according to the present invention further comprising: a rectifying and smoothing unit comprising a full bridge rectifier 515 and a capacitor 513 to rectify and smooth an alternating current (AC) voltage 516 and to provide the direct current (DC) voltage 509.

Figure 6:
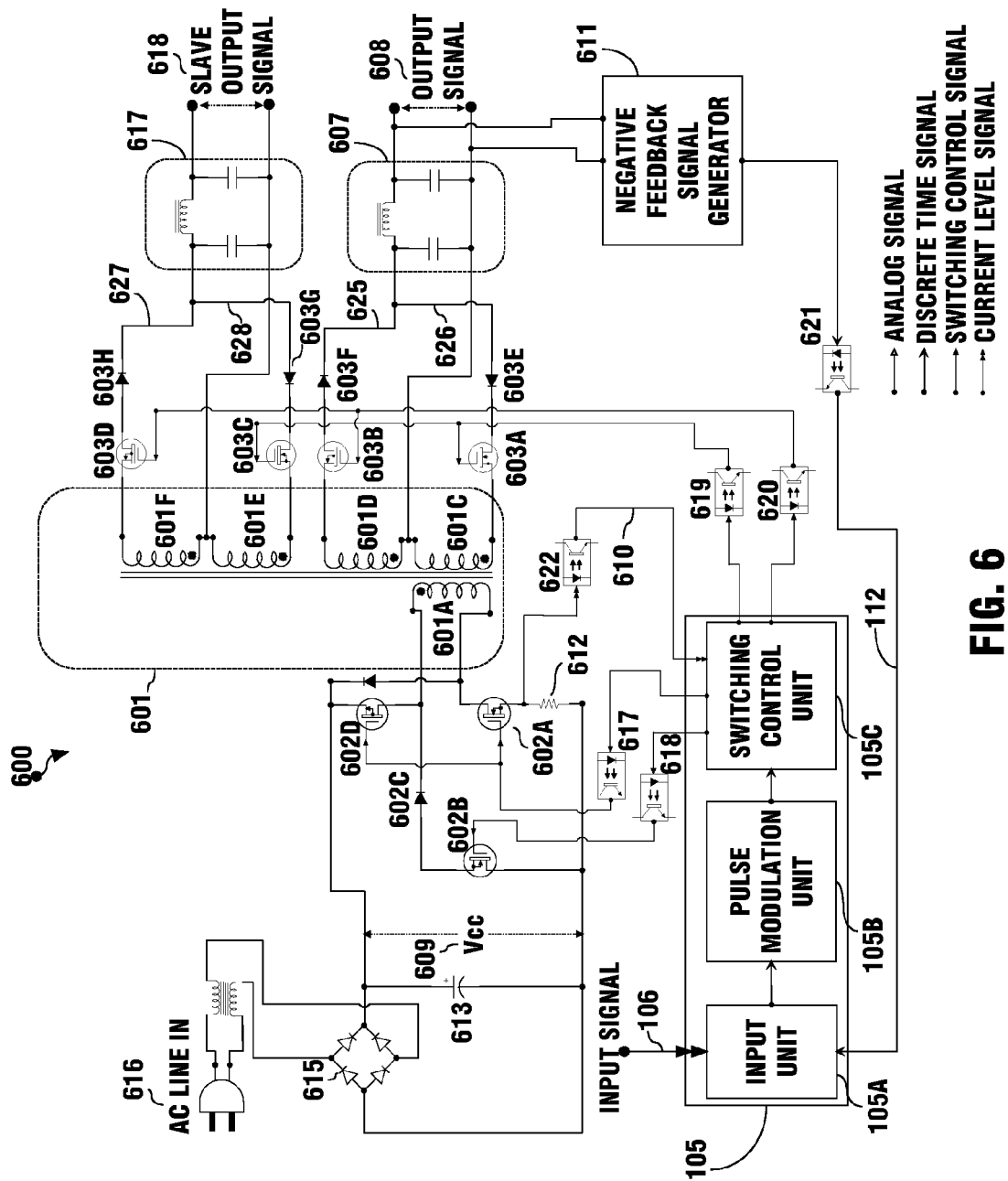
FIG. 6 is an exemplary block and circuit diagram illustrating a fourth embodiment of a switching amplifier in accordance with present invention, wherein said switching amplifier comprises a pulsed current supply unit comprising a flyback transformer and a plurality of switches for switching a first pulsed current from the flyback transformer to a filter unit when the polarity of the input signal is positive; and for switching a second pulsed current from the filter unit to the flyback transformer when the polarity of the input signal is negative, wherein the flyback transformer using its primary winding as means for discharging energy stored in the flyback transformer to a direct current (DC) voltage supply rail.

FIG. 6 is an exemplary block and circuit diagram illustrating a fourth embodiment of a switching amplifier 600 in accordance with present invention, wherein said switching amplifier 600 comprises a pulsed current supply unit comprising a flyback transformer 601 and a plurality of switches for switching a first pulsed current 625 from the flyback transformer 601 to a filter unit 607 when the polarity of the input signal 106 is positive; and for switching a second pulsed current 626 from the filter unit 607 to the flyback transformer 601 when the polarity of the input signal 106 is negative, wherein the flyback transformer 601 using its primary winding 601A as means for discharging energy stored in the flyback transformer 601 to a direct current (DC) voltage supply rail 609.

As illustrated in FIG. 6, the switching amplifier 600 of the present invention for amplifying an input signal 106 having positive and negative polarities is comprised of: a pulsed current supply unit comprising the flyback transformer 601, a plurality of switches for switching a first pulsed current 625 from the flyback transformer 601 to the filter unit 607 when the polarity of the input signal 106 is positive; and for switching a second pulsed current 626 from the filter unit 607 to the flyback transformer 601 when the polarity of the input signal 106 is negative and a feedback current signal generator 612 to generate a feedback current signal 610 by detecting the current of the flyback transformer 601; an amplifier control unit 105 for receiving the input signal 106 and the feedback current signal 610, wherein the amplifier control unit couples to the switches 602A, 602B, 602D, 603A~603D of the pulsed current supply unit to control their switching according to the input signal 106 and the feedback current signal 610; the filter unit 607 to obtain an output signal 608 corresponding to the input signal 106 by filtering the output pulsed currents 625, 626 of the pulsed current supply unit and outputting the output signal 608; wherein the input signal 106 is an analog signal, and the filter unit 607 is a low pass filter.

The switching amplifier 600 according to present invention, wherein said flyback transformer 601 comprises: a primary winding 601A for charging the flyback transformer 601 via switching on a current from a direct current (DC) voltage 609 to the primary winding 601A, also, the primary winding 601A is used for discharging energy from the flyback transformer 601 to the direct current (DC) voltage 609; an output winding unit comprising two output windings 601C, 601D for discharging energy from the flyback transformer 601 through the filter 607 to the output signal 608; and wherein the switches comprises: a first switching unit 602A, 602D coupled to the primary winding 601A for switching a current from the direct current (DC) voltage 609 to the primary winding 601A; a second switching unit 602B coupled to the flyback transformer 601 for discharging energy from the flyback transformer 601 to the direct current (DC) voltage 609; a third switching unit 603A, 603B coupled between the output winding unit 601C, 601D and the filter unit 607 for switching the first pulsed current 625 from the flyback transformer 601 to a filter unit 607 when the polarity of the input signal 106 is positive; and for switching the second pulsed current 626 from the filter unit 607 to the flyback transformer 601 when the polarity of the input signal 106 is negative.

In this non-limiting exemplary embodiment, the input signal 106 is an analog signal. And it should be noted that it is obvious for a corresponding embodiment of a switching amplifier in accordance with this invention for an input signal which is a discrete time signal.

As further illustrated in FIG. 6, the amplifier control unit 105 comprises an input unit 105A for receiving the input signal 106 and having an analog to digital converter for converting the input signal 106 to a discrete time input signal x[n]

$$x=\{x[n]\},\ 0<n<\infty;$$

a pulse modulation unit 105B for getting a pulse modulated signal from pulse modulating the discrete time input signal x[n]; and a switching control unit 105C coupled to the switches 602A, 602B, 602D, 603A, 603B control their switching according to the pulse modulated signal from the pulse modulation unit 105B.

In this non-limiting exemplary embodiment 600, the amplifier control unit 105 is a digital signal processing circuit. And it is obvious for a corresponding embodiment of an analog signal processing circuit for the amplifier control unit 105 in accordance with this invention by using an input unit for receiving an analog input signal and a pulse modulator for pulse modulating said analog input signal.

FIG. 2 are exemplary waveform diagrams illustrating the various waveforms at input and output points of switching control units in the circuits of various figures in accordance with the present invention.

As illustrated in FIG. 2, a non-limiting exemplary waveform for the pulse modulated signal from the pulse modulation unit 105B is illustrated in FIG. 2(A), since the input signal 106 has first and second polarities; therefore, the pulse modulated signal also has first and second polarities.

According to the pulse modulated signal illustrated in FIG. 2(A), a non-limiting exemplary waveform of switching control signals from the switching control unit 105C to the switches 602A, 602D for controlling its switching is illustrated in FIG. 2(I); a non-limiting exemplary waveform of switching control signal from the switching control unit 105C to the switch 602B for controlling its switching is illustrated in FIG. 2(J). Also according to the pulse modulated signal illustrated in FIG. 2(A), non-limiting exemplary waveforms of switching control signals from the switching control unit 105C to the switches 603B and 603A are illustrated in FIG. 2(K) and FIG. 2(L), respectively.

Accordingly, as illustrated in FIG. 6 and FIG. 2, when the input signal 106 is zero, the switches 603A and 603B are all switched off. The switches 602A, 602D and 602B switch on and off alternately to charge and discharge the flyback transformer 601 to regulate energy stored in the flyback transformer 601: when the switches 602A, 602D switch on and 602B switches off, the flyback transformer 601 is charging energy from the direct current (DC) voltage 609; and when the switches 602A, 602D switch off and 602B switches on, the energy contained in the flyback transformer 601 is discharged back to the direct current (DC) voltage 609. Therefore, at steady state, for approximately equal charging and discharging time, the energy flow in and out of the flyback transformer 601 are equal during each switching, therefore, this switching keeps the energy stored in the flyback transformer 601 constant. For the inductance of the flyback transformer 601 is large enough and the switching frequency of the switches 602A, 602D, 602B is fast enough, the current flow through the flyback transformer 601 keeps approximately constant since its variation is small enough.

When the input signal 106 is not zero, as illustrated in FIG. 6 and FIG. 2(A), FIGS. 2(I)~2(L), the switches 602A, 602D, 602B, 603A and 603B switch on and off alternately to keep the energy stored in the flyback transformer 601 constant, therefore when the switch 603B switches on, the current 625 from the flyback transformer 601 to the filter 607 keeps constant. Also, when the switch 603A switches on, the current 626 from the filter 607 to the flyback transformer 601 keeps constant.

As illustrated in FIG. 6 and FIG. 2(A), 2(I), 2(J), 2(K) the switch 603B switches for conducting the current 625 flowing from the flyback transformer 601 to the filter unit 607. When the polarity of the pulse modulated signal FIG. 2(A) is positive, the switch 603B switches to conduct the current 625 flowing from the flyback transformer 601 to the filter unit 607 according to the pulse modulated signal. Also, as illustrated in FIG. 6 and FIG. 2(A), 2(I), 2(J), 2(L) the switch 603A switches for conducting the current 626 flowing from the filter unit 607 to the flyback transformer 601. When the polarity of the pulse modulated signal FIG. 2(A) is negative, the switch 603A switches to conduct the current 626 flowing from the filter unit 607 to the flyback transformer 601 according to the pulse modulated signal.

As further illustrated in FIG. 6, the filter unit 607 is a low pass filter to obtain the output signal 608 corresponding to the input signal 106 by filtering the pulsed current 625 and 626 and outputting the output signal 608.

As further illustrated in FIG. 6 and FIG. 2, the level of the output signal 608 can be adjusted by control the current level of the flyback transformer 601. Based on the current level feedback signals 610 representing current flow through the flyback transformer 601, the switching control unit 105C can adjust the current flow through the flyback transformer 601 by changing the duty ratio between the charging and discharging periods of the flyback transformer 601 according to the current level feedback signals 610.

As further illustrated in FIG. 6, the switching amplifier 600 discloses a method of obtaining the output signal 608, which is a linearly amplified replica of the input signal 106 having first and second polarities, comprising the steps of: receiving the input signal 106; pulse modulating the input signal 106 for generating a pulse modulated signal having first and second polarities illustrated in FIG. 2(A); switching the pulsed current 625 flowing to a first input terminal of the filter unit 607 according to the pulse modulated signal illustrated in FIG. 2(A) when the polarity of the pulse modulated signal is positive; switching the pulsed current 626 flowing from the first input terminal of the filter unit 607 according to the pulse modulated signal when the polarity of the pulse modulated signal is negative; filtering the pulsed currents 625, 626 via the filter unit 607 for getting the output signal 608.

As further illustrated in FIG. 6, wherein said switching pulsed current 625 flowing to the first input terminal of the filter 607 according to the pulse modulated signal illustrated in FIG. 2(A) when the polarity of the pulse modulated signal is positive and switching pulsed currents 626 flowing from the first input terminal of the filter 607 according to the pulse modulated signal illustrated in FIG. 2(A) when the polarity of the pulse modulated signal is negative comprises the steps of: charging the flyback transformer 601 via switching on a current from a direct current (DC) voltage 609 to the primary winding 601A of the flyback transformer 601, wherein the primary winding 601A is also used for discharging energy stored in the flyback transformer 601 to the direct current (DC) voltage 609; and an output winding unit comprising output windings 601C, 601D for discharging energy stored in the flyback transformer 601 through the filter 607 to the output signal 608; discharging the flyback transformer 601 via switching off the current from the direct current (DC) voltage 609 to the primary winding 601A and switching on a current from the output winding 601D to the filter 607 for getting the first pulsed current 625 or switching on a current from the filter 607 to the output winding 601C for getting the second pulsed current 626, or switching on a current from the primary winding 601A to the direct current (DC) voltage 609 for discharging energy stored in the flyback transformer 601 to the direct current (DC) voltage 609; wherein said charging and discharging are controlled according to a feedback current signal 610 corresponding to the current of the primary winding 601A to regulate energy stored in the flyback transformer 601.

As further illustrated in FIG. 6, the switching amplifier 600 further comprises a negative feedback signal generator 611 to generate a negative feedback signal 112 corresponding to the output signal 608, wherein the amplifier control unit 105 integrates the input signal 106 and the negative feedback signal 112.

FIG. 3 is an exemplary block and circuit diagram illustrating an embodiment of the amplifier control unit 105 integrating an input signal 106 and a negative feedback signal 112 in FIG. 6 in accordance with the present invention.

As illustrated in FIG. 3 and FIG. 6, the input unit 105A has an analog to digital converter 301 and further comprises a linear digital transformer 302 and a negative feedback controller 303. Wherein the analog to digital converter 301 receives the input signal 106 and converts the input signal 106 to a discrete time input signal:

$$x=\{x[n]\}, 0<n<\infty;$$

The linear digital transformer 302 transforms the discrete time input signal x[n] by multiplying a gain G to the discrete time input signal (the default value of the gain G is 1):

$$X[n]=\{G \times x[n]\}, 0<n<\infty$$

to get a compensated discrete time signal X[n] and sends the compensated discrete time signal X[n] to pulse modulation unit 105B.

Accordingly, for the switching amplifier 100 further comprises the negative feedback signal generator 611 to generate the negative feedback signal 112 corresponding to the output signal 608 and the amplifier control unit 105 integrates the input signal 106 and the negative feedback signal 112, the pulse modulation unit 105B receives the compensated discrete time signal X[n].

As further illustrated in FIG. 3, the negative feedback controller 303 receives the discrete time input signal from the analog to digital converter 301 and compares it to the negative feedback signal 112, therefore to adjust the gain G of the linear digital transformer 302 according to the comparison. For example, if the negative feedback signal 112 corresponding to the output signal 608 shows that the output signal 608 is below a required level, then the negative feedback controller 303 will increase the gain G of the linear digital transformer 302 to increase the output signal 608, wherein said required level is obtained according to the discrete time input signal.

In this non-limiting exemplary embodiment 600, the amplifier control unit 105 is a digital signal processing circuit. And it is obvious for a corresponding embodiment of an analog signal processing circuit for the amplifier control unit 105 in accordance with this invention by using an analog input unit for receiving an analog input signal, a programmable gain amplifier for amplifying the an analog input signal and a pulse modulator for pulse modulating said amplified analog signal.

The switching amplifier 600 according to the present invention further comprising: isolator circuits 617, 618 coupled between the switches 602A, 602D, 602B of the pulsed current supply unit and the amplifier control unit 105 to provide electric isolation between them.

The switching amplifier 600 according to the present invention further comprising: isolator circuits 619, 620 coupled between the switches 603A, 603B and the amplifier control unit 105 to provide electric isolation between them.

The switching amplifier 600 according to the present invention further comprising: isolator circuits 621 coupled between the negative feedback signal generator 611 and the amplifier control unit 105 to provide electric isolation between them.

The switching amplifier 600 according to the present invention further comprising: the flyback transformer 601 further comprising one slave output winding unit comprising slave output winding 601E, 601F; switches 603C, 603D and their corresponding filters 617 coupled to the slave output winding unit of the flyback transformer 601 for getting a slave output signal 618 corresponding to the input signal 106.

The switching amplifier 600 according to the present invention further comprising: a rectifying and smoothing unit comprising a full bridge rectifier 615 and a capacitor 613 to rectify and smooth an alternating current (AC) voltage 616 and to provide the direct current (DC) voltage 609.

Figure 7:
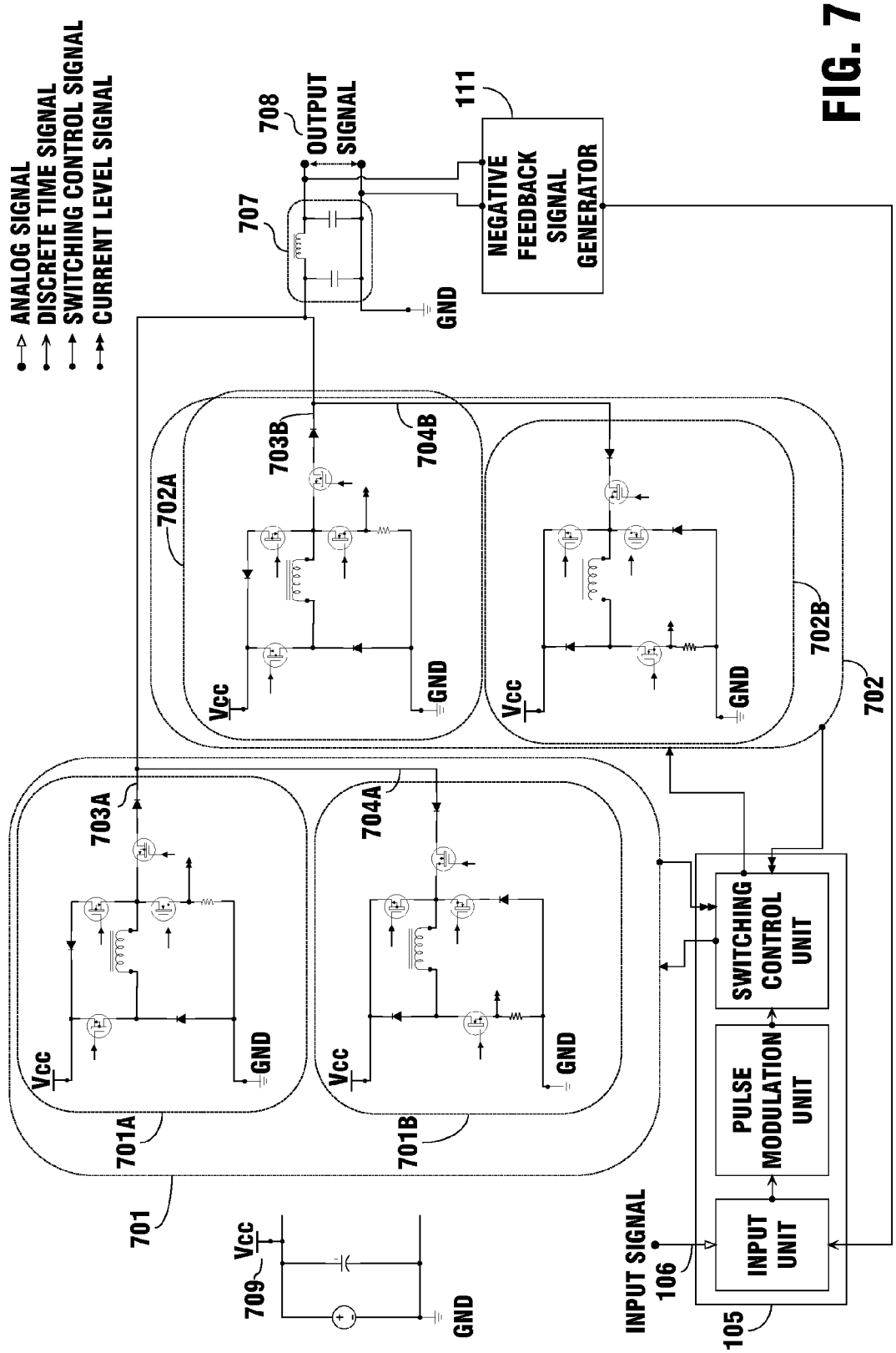
FIG. 7 is an exemplary block and circuit diagram illustrating a fifth embodiment of a switching amplifier in accordance with present invention, wherein said switching amplifier comprises two pulsed current source units and two pulsed current sink units coupled in parallel, and the inductance means of said pulsed current source units and pulsed current sink units are inductors.

FIG. 7 is an exemplary block and circuit diagram illustrating a fifth embodiment of a switching amplifier 700 in accordance with present invention, wherein said switching amplifier 700 comprises two pulsed current source units 701A, 702A and two pulsed current sink units 701B, 702B coupled in parallel, and the inductance means of said pulsed current source units 701A, 702A and pulsed current sink units 701B, 702B are inductors, as illustrated in FIG. 1.

As further illustrated in FIG. 7, the switching amplifier 700 discloses a method of obtaining an output signal 708, which is a linearly amplified replica of an input signal 106 having first and second polarities, comprising the steps of: receiving an input signal 106; pulse modulating the input signal 106 for generating a pulse modulated signal having first and second polarities; switching two pulsed currents 703A, 703B flowing to a first input terminal of a filter 707 according to the pulse modulated signal when the polarity of the pulse modulated signal is positive; switching two pulsed currents 704A, 704B flowing from the first input terminal of the filter 707 according to the pulse modulated signal when the polarity of the pulse modulated signal is negative; filtering the pulsed currents via the filter for getting the output signal 708.

According to the methods disclosed by the switching amplifiers 100, 700, it's obvious for a method of switching more than two pulsed currents flowing to a first input terminal of a filter according to the pulse modulated signal when the polarity of the pulse modulated signal is positive; and switching more than two pulsed currents flowing from the first input terminal of the filter according to the pulse modulated signal when the polarity of the pulse modulated signal is negative; for filtering the pulsed currents via the filter for getting the output signal.

Figure 8:
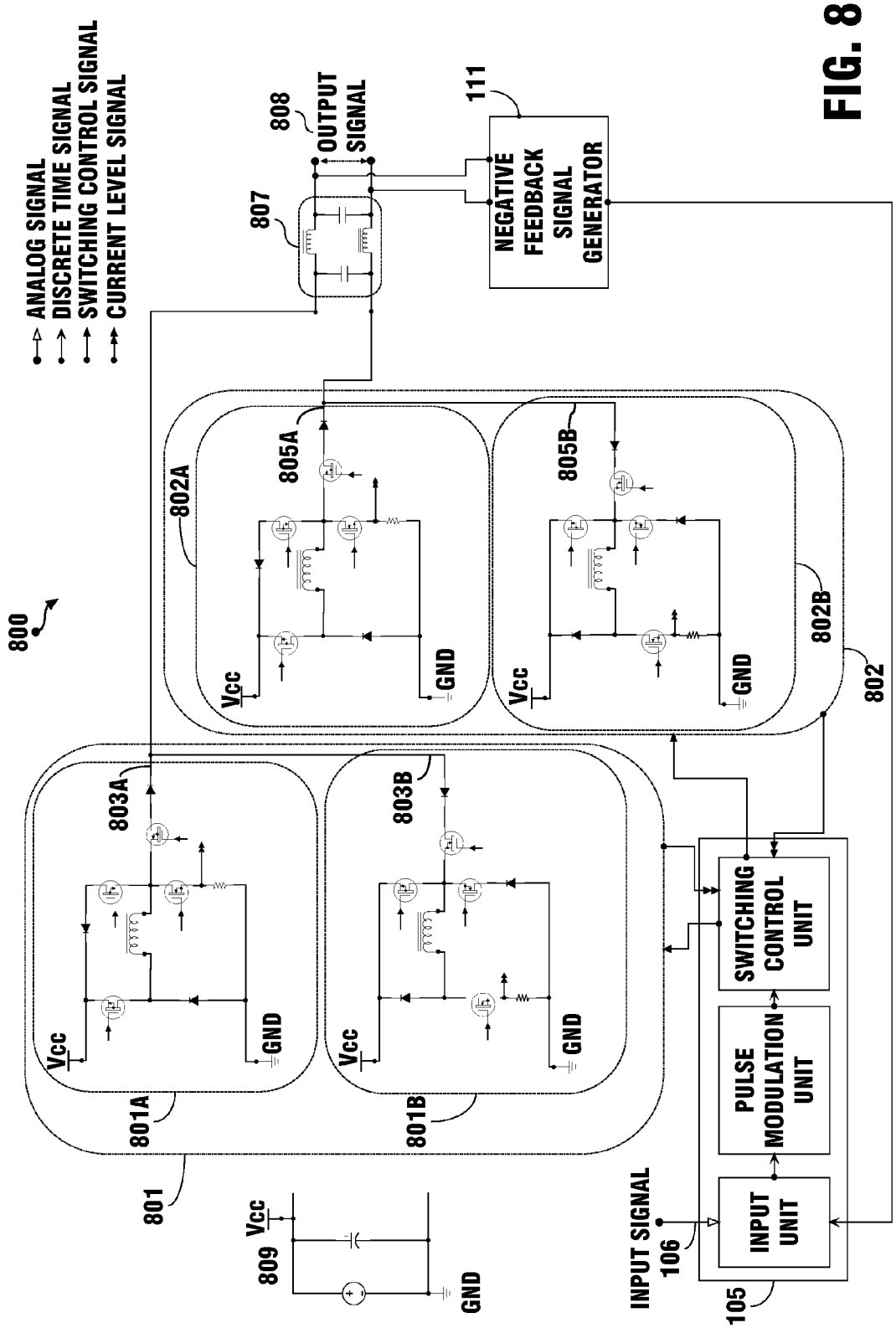
FIG. 8 is an exemplary block and circuit diagram illustrating a sixth embodiment of a switching amplifier in accordance with present invention, wherein said switching amplifier comprises a first pulsed current source unit and a first pulsed current sink unit coupled to a first terminal of the filter unit; a second pulsed current source unit and a second pulsed current sink unit coupled to a second terminal of the filter unit, and the inductance means of said pulsed current source units and pulsed current sink units are inductors.

FIG. 8 is an exemplary block and circuit diagram illustrating a sixth embodiment of a switching amplifier 800 in accordance with present invention, wherein said switching amplifier 800 comprises a first pulsed current source unit 801A and a first pulsed current sink unit 801B coupled to a first terminal of the filter unit 807; a second pulsed current source unit 802A and a second pulsed current sink unit 802B coupled to a second terminal of the filter unit 807, and the inductance means of said pulsed current source units 801A, 802A and pulsed current sink units 801B, 802B are inductors, as illustrated in FIG. 1.

As further illustrated in FIG. 8, the switching amplifier 800 discloses a method of obtaining an output signal 808, which is a linearly amplified replica of an input signal 106 having first and second polarities, comprising the steps of: receiving the input signal 106; pulse modulating the input signal 106 for generating a pulse modulated signal having first and second polarities; switching a pulsed current 803A flowing to a first input terminal of a filter 807 according to the pulse modulated signal when the polarity of the pulse modulated signal is positive; switching a pulsed current 803B flowing from the first input terminal of the filter 807 according to the pulse modulated signal when the polarity of the pulse modulated signal is negative; switching a pulsed current 805B flowing from a second input terminal of the filter 807 according to the pulse modulated signal when the polarity of the pulse modulated signal is positive; switching a pulsed current 805A flowing to the second input terminal of the filter 807 according to the pulse modulated signal when the polarity of the pulse modulated signal is negative; filtering the pulsed currents 803A, 803B, 805A, 805B via the filter 807 for getting the output signal 808.

Figure 9:
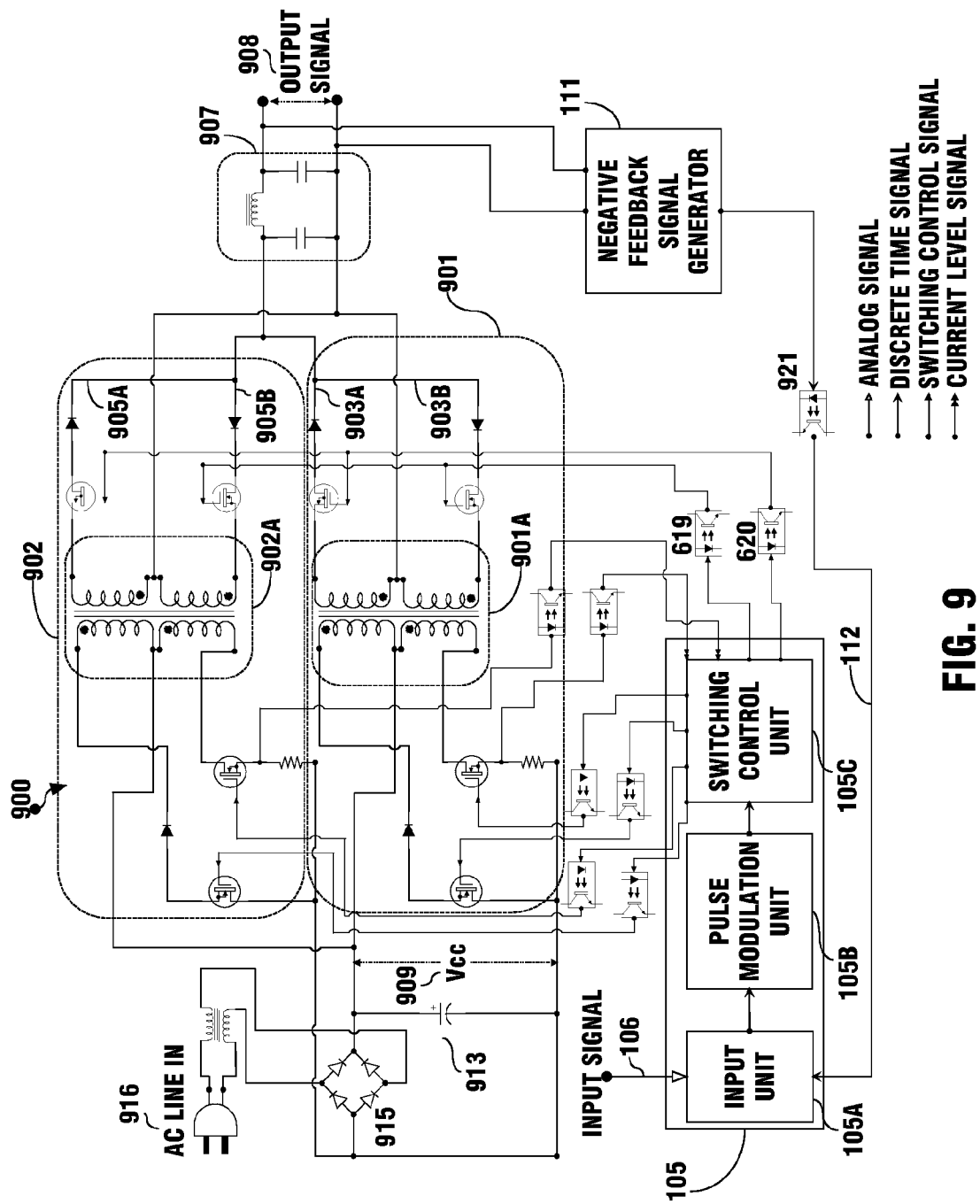
FIG. 9 is an exemplary block and circuit diagram illustrating a seventh embodiment of a switching amplifier in accordance with present invention, wherein said switching amplifier comprises two a pulsed current supply units coupled in parallel, wherein each of said pulsed current supply units comprises a flyback transformer.

FIG. 9 is an exemplary block and circuit diagram illustrating a seventh embodiment of a switching amplifier 900 in accordance with present invention, wherein said switching amplifier comprises two a pulsed current supply units 901, 902 coupled in parallel, wherein each of said pulsed current supply units 901, 902 comprises a flyback transformer 901A, 902A, as illustrated in FIG. 5.

As further illustrated in FIG. 9, the switching amplifier 900 discloses a method of obtaining an output signal 908, which is a linearly amplified replica of an input signal 106 having first and second polarities, comprising the steps of: receiving the input signal 106; pulse modulating the input signal 106 for generating a pulse modulated signal having first and second polarities; switching two pulsed currents 903A, 905A flowing to a first input terminal of a filter 907 according to the pulse modulated signal when the polarity of the pulse modulated signal is positive; switching two pulsed currents 903B, 905B flowing from the first input terminal of the filter 907 according to the pulse modulated signal when the polarity of the pulse modulated signal is negative; filtering the pulsed currents 903A, 903B, 905A, 905B via the filter 907 for getting the output signal 908.

According to the methods disclosed by the switching amplifiers 500, 900, it's obvious for a method of switching more than two pulsed currents flowing to a first input terminal of a filter according to the pulse modulated signal when the polarity of the pulse modulated signal is positive; and switching more than two pulsed currents flowing from the first input terminal of the filter according to the pulse modulated signal when the polarity of the pulse modulated signal is negative; for filtering the pulsed currents via the filter for getting the output signal.

Figure 10:
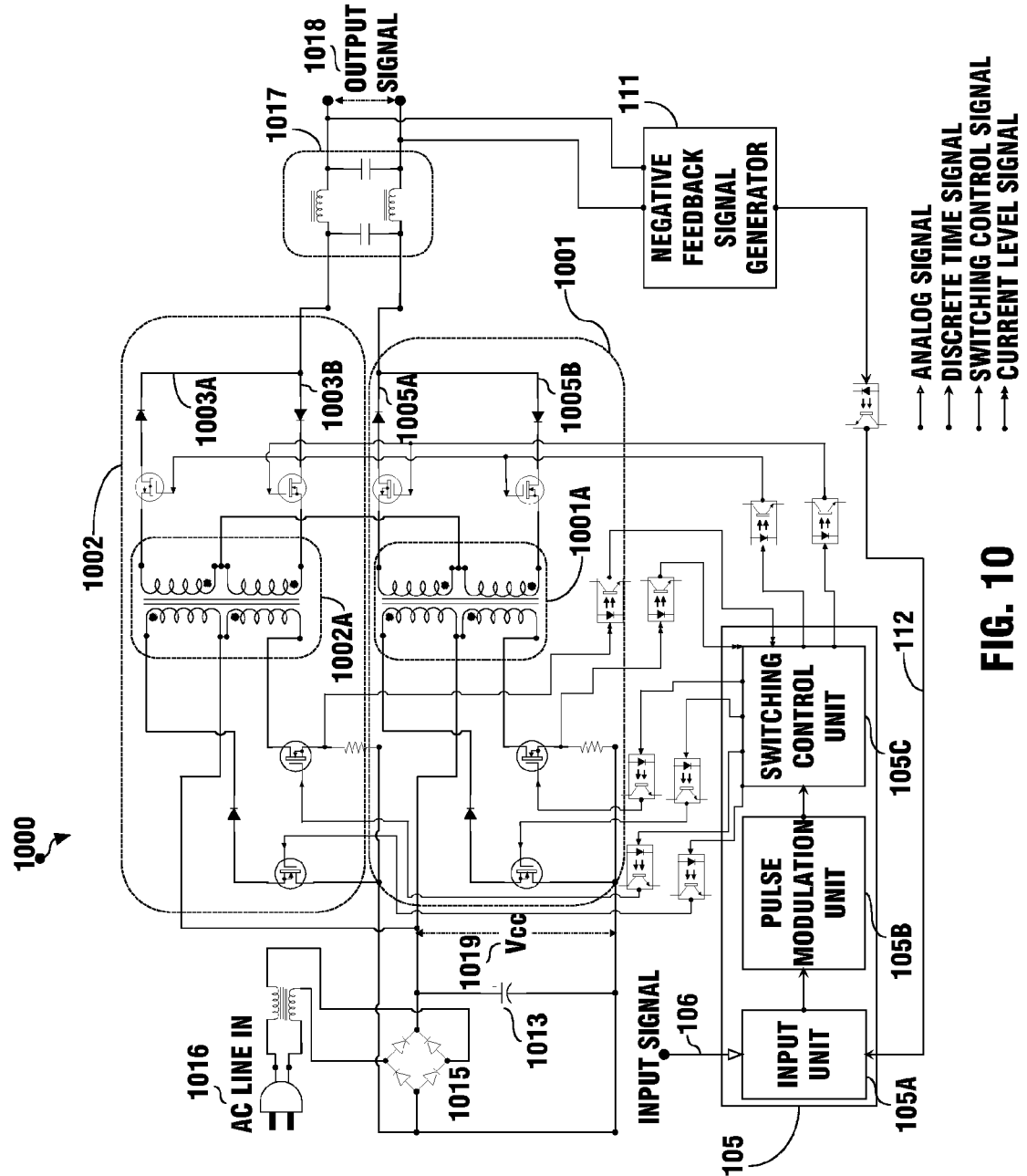
FIG. 10 is an exemplary block and circuit diagram illustrating an eighth embodiment of a switching amplifier in accordance with present invention, wherein said switching amplifier comprises a first pulsed current supply unit coupled to a first terminal of the filter unit and a second pulsed current supply unit coupled to a second terminal of the filter unit, and each of said pulsed current supply units comprises a flyback transformer.

FIG. 10 is an exemplary block and circuit diagram illustrating an eighth embodiment of a switching amplifier 1000 in accordance with present invention, wherein said switching amplifier comprises a first pulsed current supply unit 1001 coupled to a first terminal of the filter unit 1017 and a second pulsed current supply unit 1002 coupled to a second terminal of the filter unit 1017, and each of said pulsed current supply units 1001, 1002 comprises a flyback transformer 1001A, 1002A, as illustrated in FIG. 5.

As further illustrated in FIG. 10, the switching amplifier 1000 discloses a method of obtaining an output signal 1018, which is a linearly amplified replica of an input signal 106 having first and second polarities, comprising the steps of: receiving the input signal 106; pulse modulating the input signal 106 for generating a pulse modulated signal having first and second polarities; switching a pulsed current 1003A flowing to a first input terminal of a filter 1017 according to the pulse modulated signal when the polarity of the pulse modulated signal is positive; switching a pulsed current 1003B flowing from the first input terminal of the filter 1017 according to the pulse modulated signal when the polarity of the pulse modulated signal is negative; switching a pulsed current 1005B flowing from a second input terminal of the filter 1017 according to the pulse modulated signal when the polarity of the pulse modulated signal is positive; switching a pulsed current 1005A flowing to the second input terminal of the filter 1017 according to the pulse modulated signal when the polarity of the pulse modulated signal is negative; filtering the pulsed currents 1003A, 1003B, 1005A, 1005B via the filter 1017 for getting the output signal 1018.

Figure 11:
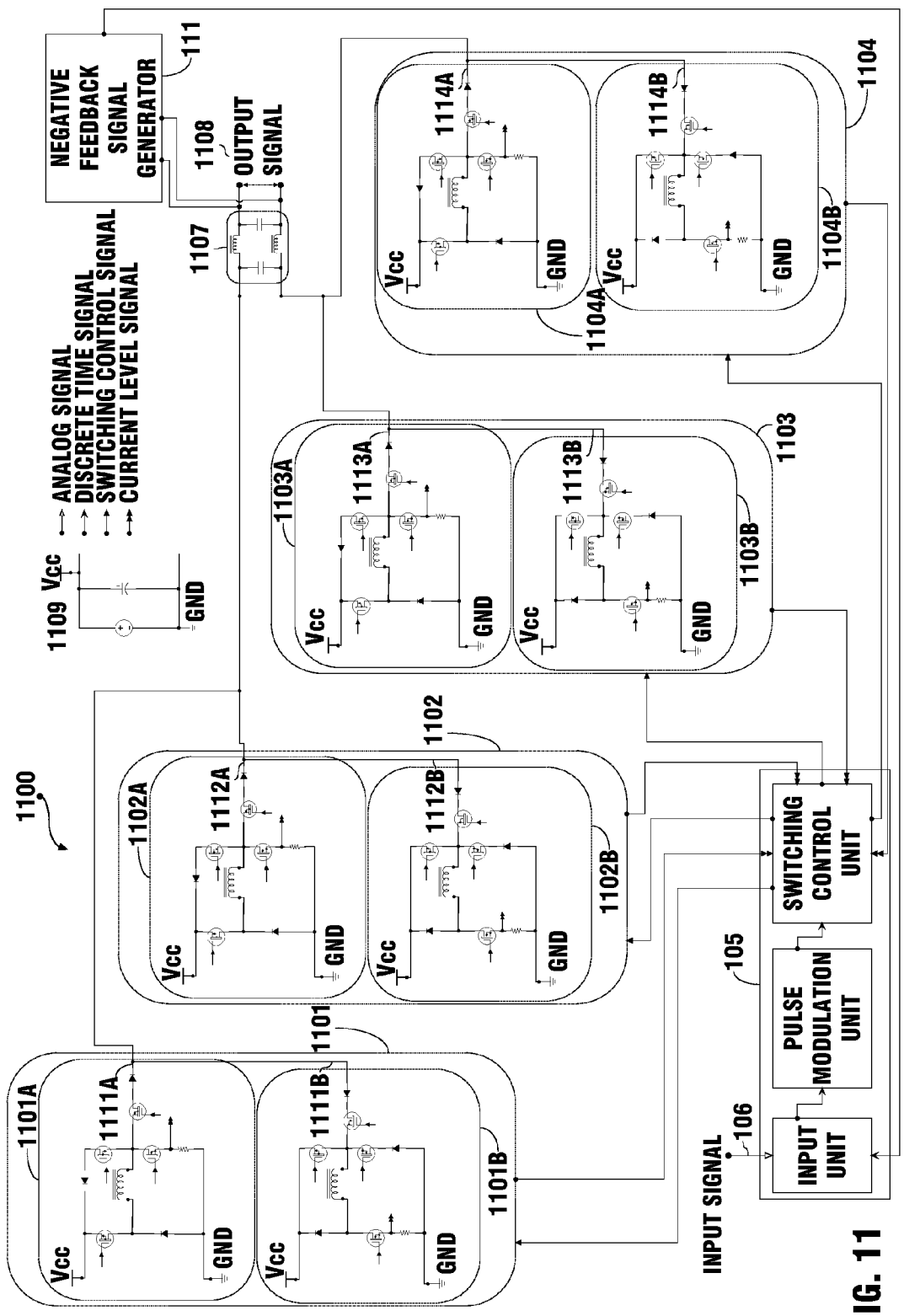
FIG. 11 is an exemplary block and circuit diagram illustrating a ninth embodiment of a switching amplifier in accordance with present invention, wherein said switching amplifier comprises first two pulsed current source units and two pulsed current sink units coupled in parallel and coupled to a first terminal of the filter unit, and second two pulsed current source units and two pulsed current sink units coupled in parallel and coupled to a second terminal of the filter unit, and the inductance means of said pulsed current source units and pulsed current sink units are inductors.

FIG. 11 is an exemplary block and circuit diagram illustrating a ninth embodiment of a switching amplifier 1100 in accordance with present invention, wherein said switching amplifier 1100 comprises first two pulsed current source units 1101A, 1102A and two pulsed current sink units 1101B, 1102B coupled in parallel and coupled to a first terminal of the filter unit 1107, and second two pulsed current source units 1103A, 1103B and two pulsed current sink units 1103B, 1104B coupled in parallel and coupled to a second terminal of the filter unit 1107, and the inductance means of said pulsed current source units and pulsed current sink units are inductors, as illustrated in FIG. 1.

As further illustrated in FIG. 11, the switching amplifier 1100 discloses a method of obtaining an output signal 1108, which is a linearly amplified replica of an input signal 106 having first and second polarities, comprising the steps of: receiving the input signal 106; pulse modulating the input signal 106 for generating a pulse modulated signal having first and second polarities; switching two pulsed currents 1111A, 1112A flowing to a first input terminal of a filter 1107 according to the pulse modulated signal when the polarity of the pulse modulated signal is positive; switching two pulsed currents 1111B, 1112B flowing from the first input terminal of the filter 1107 according to the pulse modulated signal when the polarity of the pulse modulated signal is negative; switching two pulsed currents 1113B, 1114B flowing from a second input terminal of the filter 1107 according to the pulse modulated signal when the polarity of the pulse modulated signal is positive; switching two pulsed currents 1113A, 1114A flowing to the second input terminal of the filter 1107 according to the pulse modulated signal when the polarity of the pulse modulated signal is negative; filtering the pulsed currents 1111A,1111B, 1112A, 1112B, 1113A, 1113B via the filter 1107 for getting the output signal 1108.

According to the methods disclosed by the switching amplifiers 100, 1100, it's obvious for a method of switching more than two pulsed currents flowing to a first input terminal of a filter according to the pulse modulated signal when the polarity of the pulse modulated signal is positive; switching more than two pulsed currents flowing from the first input terminal of the filter according to the pulse modulated signal when the polarity of the pulse modulated signal is negative; switching more than two pulsed currents flowing from a second input terminal of the filter according to the pulse modulated signal when the polarity of the pulse modulated signal is positive; switching more than two pulsed currents flowing to the second input terminal of the filter according to the pulse modulated signal when the polarity of the pulse modulated signal is negative; for filtering the pulsed currents via the filter for getting the output signal.

Figure 12:
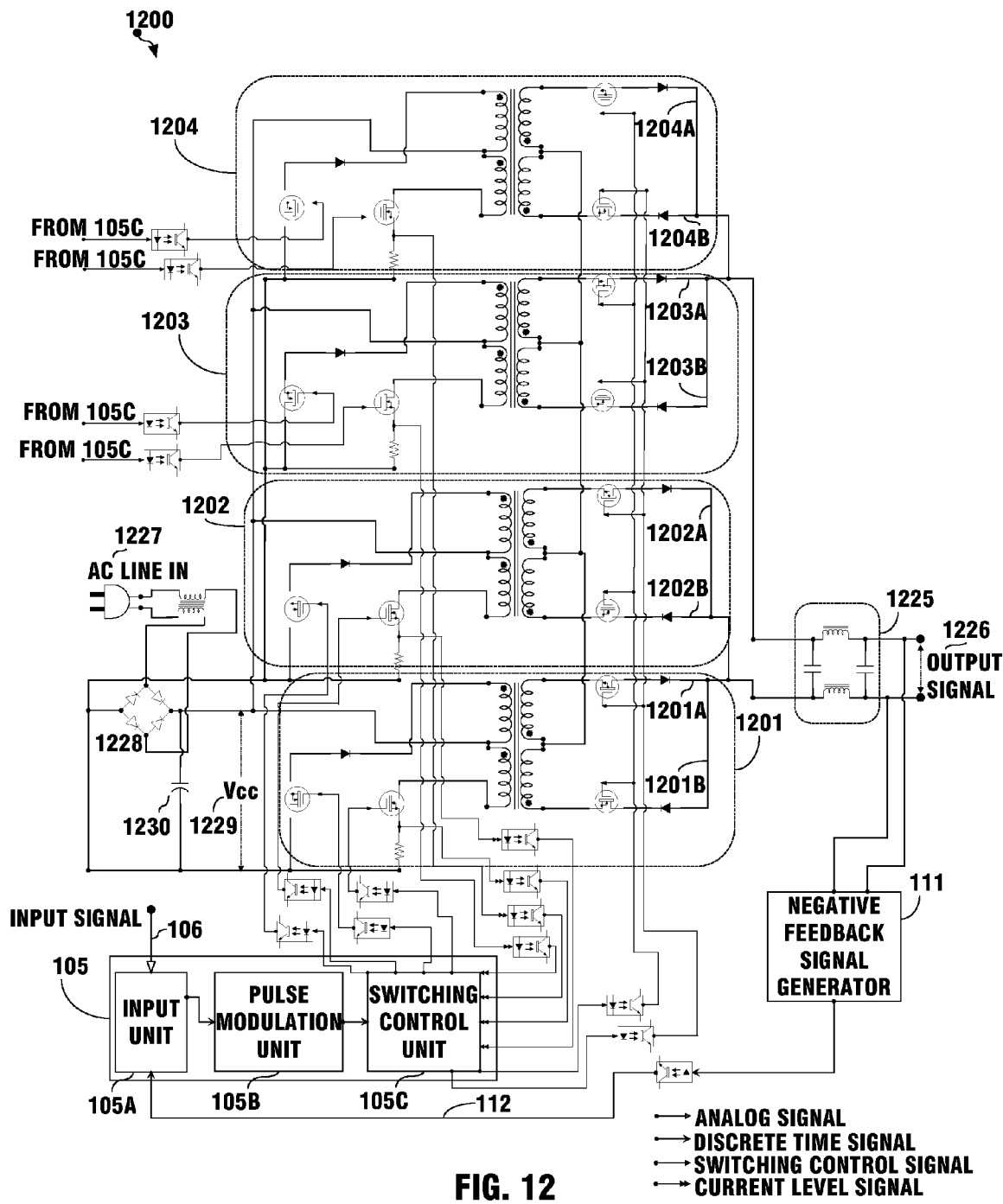
FIG. 12 is an exemplary block and circuit diagram illustrating a tenth embodiment of a switching amplifier in accordance with present invention, wherein said switching amplifier comprises first two pulsed current supply units coupled in parallel and coupled to a first terminal of the filter unit, and second two pulsed current supply units coupled in parallel and coupled to a second terminal of the filter unit, and each of said pulsed current supply units comprises a flyback transformer.

FIG. 12 is an exemplary block and circuit diagram illustrating a tenth embodiment of a switching amplifier 1200 in accordance with present invention, wherein said switching amplifier comprises first two pulsed current supply units 1201, 1202 coupled in parallel and coupled to a first terminal of the filter unit 1225, and second two pulsed current supply units 1203, 1204 coupled in parallel and coupled to a second terminal of the filter unit 1225, and each of said pulsed current supply units comprises a flyback transformer, as illustrated in FIG. 5.

As further illustrated in FIG. 12, the switching amplifier 1200 discloses a method of obtaining an output signal 1226, which is a linearly amplified replica of an input signal 106 having first and second polarities, comprising the steps of: receiving the input signal 106; pulse modulating the input signal 106 for generating a pulse modulated signal having first and second polarities; switching two pulsed currents 1203A, 1204A flowing to a first input terminal of a filter 1225 according to the pulse modulated signal when the polarity of the pulse modulated signal is positive; switching two pulsed currents 1203B, 1204B flowing from the first input terminal of the filter 1225 according to the pulse modulated signal when the polarity of the pulse modulated signal is negative; switching two pulsed currents 1201B, 1202B flowing from a second input terminal of the filter 1225 according to the pulse modulated signal when the polarity of the pulse modulated signal is positive; switching two pulsed currents 1201A, 1202A flowing to the second input terminal of the filter 1225 according to the pulse modulated signal when the polarity of the pulse modulated signal is negative; filtering the pulsed currents 1201A, 1201B, 1202A, 1202B, 1203A, 1203B, 1204A, 1204B via the filter 1225 for getting the output signal 1226.

According to the methods disclosed by the switching amplifiers 100, 1200, it's obvious for a method of switching more than two pulsed currents flowing to a first input terminal of a filter according to the pulse modulated signal when the polarity of the pulse modulated signal is positive; switching more than two pulsed currents flowing from the first input terminal of the filter according to the pulse modulated signal when the polarity of the pulse modulated signal is negative; switching more than two pulsed currents flowing from a second input terminal of the filter according to the pulse modulated signal when the polarity of the pulse modulated signal is positive; switching more than two pulsed currents flowing to the second input terminal of the filter according to the pulse modulated signal when the polarity of the pulse modulated signal is negative; for filtering the pulsed currents via the filter for getting the output signal.

From the switching amplifiers 100, 400, 500, 600, 700, 800, 900, 1000, 1100, 1200 in accordance with the present invention, one aspect of the present invention provides a switching amplifier that is highly efficient and without the "dead time" problem related to the class D amplifiers. Accordingly, the switches of the switching amplifiers 100, 400 and 500 are never short the direct current (DC) voltage through themselves.

From the switching amplifiers 100, 400, 500, 600, 700, 800, 900, 1000, 1100, 1200 in accordance with the present invention, another aspect of the present invention provides a switching amplifier that its output signal is completely off when there is no input signal, as illustrated in FIG. 2.

From the switching amplifiers 100, 400, 500, 600, 700, 800, 900, 1000, 1100, 1200 in accordance with the present invention, yet another aspect of the present invention provides a switching amplifier comprised of an act of comparing an input signal with an output feedback signal for detection and correction of overall system signal processes therefore is substantially immune to DC current source supply and load perturbations, as illustrated in FIGS. 1, 4, 5, 6, 7, 8, 9, 10, 11, 12.

It is to be understood that the above described embodiments are merely illustrative of the principles of the invention and that other arrangements may be devised by those skilled in the art without departing from the spirit and scope of the invention.

What is claimed is:

1. A method of obtaining an output signal, which is a linearly amplified replica of an input signal, comprising:
   receiving the input signal having first and second polarities;
   pulse modulating the input signal for generating a pulse modulated signal;
   switching at least one pulsed current flowing to a first input terminal of a filter according to the pulse modulated signal when the polarity of the input signal is positive;
   switching at least one pulsed current flowing from the first input terminal of the filter according to the pulse modulated signal when the polarity of the input signal is negative;
   filtering said at least one pulsed currents flowing to the first input terminal and said at least one pulsed current flowing from the first input terminal via the filter for getting the output signal.

2. The method of claim 1, wherein switching the pulsed current flowing to the first input terminal of the filter according to the pulse modulated signal when the polarity of the input signal is positive comprises:
   switching a current from a direct current (DC) voltage to a first inductance means for charging the first inductance means;
   switching the pulsed current flowing to the first input terminal from the first inductance means according to the pulse modulated signal for discharging the first inductance means to through the filter to the output signal;
   switching a current from the first inductance means to the direct current (DC) voltage for discharging the first inductance means to the direct current (DC) voltage;
   wherein switching the current from the direct current (DC) voltage to the first inductance means, switching the pulsed current flowing to the first input terminal from the first inductance means, and switching the current from the first inductance means to the direct current (DC) voltage are controlled according to a feedback current signal corresponding to the current of the first inductance means to regulate the current of the first inductance means, wherein the first inductance means is at least one inductor or flyback transformer;
   and switching the pulsed current flowing from the first input terminal of the filter according to the pulse modulated signal when the polarity of the input signal is negative comprises:
   switching a current from the direct current (DC) voltage to a second inductance means for charging the second inductance means;
   switching the pulsed current flowing from the first input terminal to the second inductance means according to the pulse modulated signal for discharging the second inductance means through the filter to the output signal;

switching a current from the second inductance means to the direct current (DC) voltage for discharging the second inductance means to the direct current (DC) voltage;

wherein switching the current from the direct current (DC) voltage to the second inductance means, switching the pulsed current flowing from the first input terminal to the second inductance means, and switching the current from the second inductance means to the direct current (DC) voltage are controlled according to a feedback current signal corresponding to the current of the second inductance means to regulate the current of the second inductance means, wherein the second inductance means is at least one inductor or flyback transformer.

3. The method of claim 2 further comprising:

getting one or more than one slave output signals that are linearly amplified replicas of the input signal via using corresponding slave output winding units of the first inductance means and the second inductance means, wherein said first and second inductance means are flyback transformers, and each of said flyback transformers further comprises one or more than one slave output winding units and each slave output winding unit comprises one or more than one output windings for discharging energy from the flyback transformer to its corresponding slave output signal.

4. The method of claim 1, wherein switching the pulsed current flowing to the first input terminal of the filter according to the pulse modulated signal when the polarity of the input signal is positive and switching the pulsed current flowing from the first input terminal of the filter according to the pulse modulated signal when the polarity of the input signal is negative comprise:

switching a current from a direct current (DC) voltage to a primary winding of a flyback transformer for charging the flyback transformer, wherein the flyback transformer further comprises a discharging winding or using the primary winding for discharging energy stored in the flyback transformer to the direct current (DC) voltage and an output winding unit comprising one or more than one output windings for discharging energy stored in the flyback transformer through the filter to the output signal;

switching the pulsed current flowing to the first input terminal from the output winding unit according to the pulse modulated signal when the polarity of the input signal is positive or switching the pulsed current flowing from the first input terminal to the output winding unit according to the pulse modulated signal when the polarity of the input signal is negative for discharging the flyback transformer through the filter to the output signal;

switching a current from the flyback transformer to the direct current (DC) voltage for discharging the flyback transformer to the direct current (DC) voltage;

wherein switching the current from the direct current (DC) voltage to the primary winding, switching the pulsed current flowing to the first input terminal from the output winding unit, switching the pulsed current flowing from the first input terminal to the output winding unit, and switching the current from the flyback transformer to the direct current (DC) voltage are controlled according to a feedback current signal corresponding to the current of the flyback transformer to regulate energy stored in the flyback transformer.

5. The method of claim 4 further comprising:

getting one or more than one slave output signals that are linearly amplified replicas of the input signal using corresponding slave output winding units of said flyback transformer, wherein said flyback transformer further comprises one or more than one slave output winding units and each slave output winding unit comprises one or more than one output windings for discharging energy from the flyback transformer to its corresponding slave output signal.

6. The method of claim 1 further comprising:

switching at least one pulsed current flowing from a second input terminal of the filter according to the pulse modulated signal when the polarity of the input signal is positive;

switching at least one pulsed current flowing to the second input terminal of the filter according to the pulse modulated signal when the polarity of the input signal is negative;

filtering the pulsed current flowing from the second input terminal and the pulsed current flowing to the second input terminal via the filter for getting the output signal.

7. The method of claim 1 further comprising:

getting a feedback signal by detecting the output signal and integrating the feedback signal to process a negative feedback control.

8. A switching amplifier for getting an output signal, which is a linearly amplified replica of an input signal having first and second polarities, said switching amplifier comprising:

one or more than one pulsed current source units, wherein each of the pulsed current source units comprises an inductance means, a plurality of switches for switching a pulsed current from the inductance means of the pulsed current source unit to a filter unit when the polarity of the input signal is positive, and a feedback current signal generator to generate a feedback current signal by detecting the current of the inductance means of the pulsed current source unit;

one or more than one pulsed current sink units, wherein each of the pulsed current sink units comprises an inductance means, a plurality of switches for switching a pulsed current from the filter unit to the inductance means of the pulsed current sink unit when the polarity of the input signal is negative, and a feedback current signal generator to generate a feedback current signal by detecting the current of the inductance means of the pulsed current sink unit;

an amplifier control unit for receiving the input signal, the feedback current signals from the pulsed current source units and the pulsed current sink units, wherein the amplifier control unit couples to the switches of the pulsed current source units and the pulsed current sink units to control their switching according to the input signal and the feedback current signals;

the filter unit that filters the pulsed currents from the pulsed current source units to the filter unit and the pulsed currents from the filter unit to the pulsed current sink units for outputting the output signal.

9. The switching amplifier according to claim 8, wherein the input signal is an analog signal or a discrete time signal, the inductance means is at least one inductor or flyback transformer, and the filter unit is a low pass filter, a band pass filter, or a band stop filter.

10. The switching amplifier according to claim 8, wherein said plurality of switches of each of the pulsed current source units comprises:

a first switching unit of the pulsed current source unit coupled to the inductance means of the pulsed current source unit for switching a current from the direct current (DC) voltage to the inductance means of the pulsed current source unit;

a second switching unit of the pulsed current source unit coupled to the inductance means of the pulsed current source unit for switching a current from the inductance means of the pulsed current source unit to the direct current (DC) voltage;

a third switching unit of the pulsed current source unit coupled between the inductance means of the pulsed current source unit and the filter unit for switching the pulsed current from the inductance means of the pulsed current source unit to the filter unit;

and said plurality of switches of each of the pulsed current sink units comprises:

a first switching unit of the pulsed current sink unit coupled to the inductance means of the pulsed current sink unit for switching a current from the direct current (DC) voltage to the inductance means of the pulsed current sink unit;

a second switching unit of the pulsed current sink unit coupled to the inductance means of the pulsed current sink unit for switching a current from the inductance means of the pulsed current sink unit to the direct current (DC) voltage;

a third switching unit coupled between the inductance means of the pulsed current sink unit and the filter unit for switching the pulsed current from the filter unit to the inductance means of the pulsed current sink unit.

11. The switching amplifier according to claim 8, further comprising:

a rectifying and smoothing unit to rectify and smooth an alternating current (AC) voltage and to provide the direct current (DC) voltage.

12. The switching amplifier according to claim 8, wherein the inductance means of the pulsed current source units and the pulsed current sink units are flyback transformers, further comprising:

each said flyback transformers further comprising one or more than one slave output windings;

one or more than one switching units coupled to corresponding slave output windings;

one or more than one filter units that each one couples to its corresponding switching unit coupled to its corresponding slave output winding for getting one or more than one slave output signals corresponding to the input signal.

13. The switching amplifier according to claim 8 further comprising:

a negative feedback signal generator to generate a negative feedback signal corresponding to the output signal, wherein the amplifier control unit integrates the input signal and the negative feedback signal to process a negative feedback control.

14. The switching amplifier according to claim 8 further comprising one or more than one isolator circuits coupled between the switches, the feedback current signal generators or the negative feedback signal generator and the amplifier control unit to provide electric isolation between the switches, the feedback current signal generators or the negative feedback signal generator and the amplifier control unit.

15. A switching amplifier for getting an output signal, which is a linearly amplified replica of an input signal having first and second polarities, said switching amplifier comprising:

one or more than one pulsed current supply units, wherein each of the pulsed current supply units comprises a flyback transformer, a plurality of switches for switching a first pulsed current flowing from the flyback transformer to a filter unit when the polarity of the input signal is positive and for switching a second pulsed current flowing from the filter unit to the flyback transformer when the polarity of the input signal is negative and a feedback current signal generator to generate a feedback current signal by detecting the current of the flyback transformer;

an amplifier control unit for receiving the input signal and the feedback current signals from the pulsed current supply units, wherein the amplifier control unit couples to the switches of the pulsed current supply units to control their switching according to the input signal and the feedback current signals;

the filter unit that filters the first pulsed currents flowing from the pulsed current supply units to the filter unit and the second pulsed currents flowing from the filter unit to the pulsed current supply units for outputting the output signal;

wherein the input signal is an analog signal or a discrete time signal, and the filter unit is a low pass filter, a band pass filter, or a band stop filter.

16. The switching amplifier according to claim 15, wherein the flyback transformer of each pulsed current supply units comprises a primary winding for charging the flyback transformer via switching on a current from a direct current (DC) voltage to the primary winding;

a discharging winding or using the primary winding for discharging energy from the flyback transformer to the direct current (DC) voltage;

an output winding unit comprising one or more than one output windings for discharging energy from the flyback transformer through the filter to the output signal;

and wherein the plurality of switches of each pulsed current supply units comprises:

a first switching unit coupled to the primary winding for switching a current from the direct current (DC) voltage to the primary winding;

a second switching unit coupled to the flyback transformer for discharging energy from the flyback transformer to the direct current (DC) voltage;

a third switching unit coupled between the output winding unit and the filter unit for switching the first pulsed current from the flyback transformer to a filter unit when the polarity of the input signal is positive; and for switching the second pulsed current from the filter unit to the flyback transformer when the polarity of the input signal is negative.

17. The switching amplifier according to claim 15, further comprising:

a rectifying and smoothing unit to rectify and smooth an alternating current (AC) voltage and to provide the direct current (DC) voltage.

18. The switching amplifier according to claim 15, further comprising:

each of said flyback transformers further comprising one or more than one slave output winding units, wherein each slave output winding unit comprises one or more than one slave output windings;

one or more than one switching units, wherein each of the switching units couples to corresponding slave output winding units of the flyback transformer;

one or more than one filter units that each one couples to its corresponding switching unit coupled to its corresponding slave output winding unit for getting one or more than one slave output signals corresponding to the input signal.

19. The switching amplifier according to claim 15 further comprising:
a negative feedback signal generator to generate a negative feedback signal corresponding to the output signal,
wherein the amplifier control unit integrates the input signal and the negative feedback signal to process a negative feedback control.

20. The switching amplifier according to claim 15 further comprising one or more than one isolator circuits coupled between the switches, the feedback current signal generators or the negative feedback signal generator and the amplifier control unit to provide electric isolation between the switches, the feedback current signal generators or the negative feedback signal generator and the amplifier control unit.

* * * * *